(12) United States Patent
Naito

(10) Patent No.: US 10,600,867 B2
(45) Date of Patent: Mar. 24, 2020

(54) SEMICONDUCTOR DEVICE HAVING AN EMITTER REGION AND A CONTACT REGION INSIDE A MESA PORTION

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 52 days.

(21) Appl. No.: 15/959,295

(22) Filed: Apr. 23, 2018

(65) Prior Publication Data

US 2018/0337233 A1 Nov. 22, 2018

(30) Foreign Application Priority Data

May 16, 2017 (JP) .................................. 2017-097284
Jan. 17, 2018 (JP) .................................. 2018-005958

(51) Int. Cl.
| | |
|---|---|
| H01L 21/02 | (2006.01) |
| H01L 29/08 | (2006.01) |
| H01L 29/732 | (2006.01) |
| H01L 29/417 | (2006.01) |
| H01L 29/66 | (2006.01) |
| H01L 29/739 | (2006.01) |
| H01L 29/423 | (2006.01) |
| H01L 29/40 | (2006.01) |
| H01L 29/06 | (2006.01) |

(52) U.S. Cl.
CPC ...... *H01L 29/0804* (2013.01); *H01L 29/0696* (2013.01); *H01L 29/0834* (2013.01); *H01L 29/407* (2013.01); *H01L 29/41708* (2013.01); *H01L 29/4238* (2013.01); *H01L 29/66545* (2013.01); *H01L 29/7325* (2013.01); *H01L 29/7396* (2013.01); *H01L 29/7397* (2013.01)

(58) Field of Classification Search
USPC ........................................................ 257/586
See application file for complete search history.

(56) References Cited

U.S. PATENT DOCUMENTS

| | | | |
|---|---|---|---|
| 2003/0042537 A1 | 3/2003 | Nakamura et al. | |
| 2007/0267663 A1 | 11/2007 | Harada | |
| 2012/0267680 A1* | 10/2012 | Oya | ..................... H01L 29/0696 257/139 |

(Continued)

FOREIGN PATENT DOCUMENTS

| | | |
|---|---|---|
| JP | 2007311627 A | 11/2007 |
| JP | 2015103697 A | 6/2015 |

(Continued)

*Primary Examiner* — Caleb E Henry

(57) ABSTRACT

A semiconductor device includes: a gate trench portion and a dummy trench portion provided extending in a predetermined direction of extension at the upper surface of the semiconductor substrate; a mesa portion sandwiched by the gate trench portion and the dummy trench portion; an emitter region provided between the upper surface of the semiconductor substrate and the drift region and provided at an upper surface of the mesa portion and adjacent to the gate trench portion; and a contact region provided between the upper surface of the semiconductor substrate and the drift region and provided at the upper surface of the mesa portion and adjacent to the dummy trench portion.

20 Claims, 16 Drawing Sheets

(56) References Cited

U.S. PATENT DOCUMENTS

| | | | | |
|---|---|---|---|---|
| 2013/0037853 A1* | 2/2013 | Onozawa | ............ | H01L 29/0661 |
| | | | | 257/139 |
| 2013/0200451 A1* | 8/2013 | Yilmaz | ............... | H01L 29/4236 |
| | | | | 257/331 |
| 2014/0054645 A1* | 2/2014 | Saito | .................. | H01L 29/0696 |
| | | | | 257/139 |
| 2014/0197876 A1* | 7/2014 | Laven | ............... | H01L 29/66325 |
| | | | | 327/375 |
| 2015/0144995 A1 | 5/2015 | Takahashi | | |
| 2015/0349103 A1* | 12/2015 | Onozawa | ............ | H01L 29/7397 |
| | | | | 257/144 |
| 2016/0190123 A1 | 6/2016 | Laven et al. | | |
| 2019/0148532 A1* | 5/2019 | Naito | .................... | H01L 21/322 |
| | | | | 257/330 |
| 2019/0157264 A1* | 5/2019 | Yoshida | .............. | H01L 27/0716 |
| 2019/0157381 A1* | 5/2019 | Naito | .................... | H01L 29/739 |
| 2019/0189750 A1* | 6/2019 | Naito | .................. | H01L 29/7397 |
| 2019/0206860 A1* | 7/2019 | Kamimura | .......... | H01L 27/0635 |
| 2019/0221642 A1* | 7/2019 | Naito | .................... | H01L 29/083 |

FOREIGN PATENT DOCUMENTS

| | | | |
|---|---|---|---|
| JP | 2016154218 A | 8/2016 | |
| JP | 2016195271 A | 11/2016 | |
| WO | WO02058160 A1 | 7/2002 | |

* cited by examiner d-d

SEMICONDUCTOR DEVICE HAVING AN EMITTER REGION AND A CONTACT REGION INSIDE A MESA PORTION

The contents of the following Japanese patent applications are incorporated herein by reference:
NO. 2017-097284 filed on May 16, 2017, and
NO. 2018-005958 filed on Jan. 17, 2018.

BACKGROUND

1. Technical Field

The present invention relates to a semiconductor device.

2. Related Art

Conventionally, semiconductor devices such as insulated-gate bipolar transistors (IGBTs) have been known (please see Patent Document 1, for example).
Patent Document 1: Japanese Patent Application Publication No. 2007-311627
It is preferable to improve characteristics such as saturation current in semiconductor devices.

SUMMARY

A first aspect of the present invention provides a semiconductor device including a semiconductor substrate having a first conductivity-type drift region. The semiconductor device may include a gate trench portion that is provided spreading from an upper surface of the semiconductor substrate and reaching an inside of the semiconductor substrate and is provided extending in a predetermined direction of extension at the upper surface of the semiconductor substrate. The semiconductor device may include a dummy trench portion that is provided spreading from the upper surface of the semiconductor substrate and reaching the inside of the semiconductor substrate and is provided extending in the direction of extension at the upper surface of the semiconductor substrate. The semiconductor device may include a mesa portion that is provided inside the semiconductor substrate and is sandwiched by the gate trench portion and the dummy trench portion. The semiconductor device may include a first conductivity-type emitter region that is provided inside the mesa portion and between the upper surface of the semiconductor substrate and the drift region, is provided at an upper surface of the mesa portion and adjacent to the gate trench portion and has a doping concentration higher than that of the drift region. The semiconductor device may include a second conductivity-type contact region that is provided inside the mesa portion and between the upper surface of the semiconductor substrate and the drift region and is provided at the upper surface of the mesa portion and adjacent to the dummy trench portion. At least either the emitter region or the contact region may be provided in a stripe shape extending in the direction of extension at the upper surface of the semiconductor substrate.

The semiconductor device may include a second conductivity-type base region that is provided inside the semiconductor substrate and between the upper surface of the semiconductor substrate and the drift region and has a doping concentration lower than that of the contact region. The emitter region and the contact region may be provided between the upper surface of the semiconductor substrate and the base region. The contact region may be provided reaching a position deeper than the emitter region as seen from the upper surface of the semiconductor substrate.

At the upper surface of the semiconductor substrate, widths of the contact region and the emitter region in a direction perpendicular to the direction of extension may be the same. In a cross-section of the semiconductor substrate that is perpendicular to the direction of extension, an inclination of a cross-section boundary between the contact region and the emitter region relative to the upper surface of the semiconductor substrate may be equal to or larger than 70 degrees and equal to or smaller than 110 degrees.

In a depth direction perpendicular to the upper surface of the semiconductor substrate, a doping concentration distribution of the contact region may have a plurality of peaks. In a depth direction perpendicular to the upper surface of the semiconductor substrate, a doping concentration distribution of the emitter region may have a plurality of peaks. At respective peak positions of the doping concentration distribution of the contact region, dopants having highest concentrations may be the same type of dopant.

At any two peak positions of the doping concentration distribution of the emitter region, dopants having highest concentrations may be different types of dopant. Respective peak positions in the doping concentration distribution of the contact region and respective peak positions in the doping concentration distribution of the emitter region may be different. Respective peak positions in the doping concentration distribution of the contact region and respective peak positions in the doping concentration distribution of the emitter region may be arranged alternately in the depth direction.

The semiconductor device may include an accumulation region that is provided in the mesa portion and between the base region and the drift region and has a doping concentration higher than that of the drift region. The semiconductor device may include a first accumulation region of the accumulation regions and a second accumulation region of the accumulation regions, the first accumulation region and the second accumulation region being provided at different positions in a depth direction perpendicular to the upper surface of the semiconductor substrate.

In the mesa portion, a trench contact portion that contacts each of the emitter region and the contact region may be provided spreading from the upper surface of the semiconductor substrate and reaching a position shallower than a bottom portion of the emitter region. In a region that is in the contact region and contacts the trench contact portion, a second conductivity-type high concentration region having a doping concentration higher than that of the contact region may be provided.

The semiconductor device may include an interlayer dielectric film provided above the upper surface of the semiconductor substrate The interlayer dielectric film may be provided with a contact hole having a width, in a direction perpendicular to the direction of extension, which is larger than a width of the mesa portion.

A second aspect of the present invention provides a semiconductor device a semiconductor substrate having a first conductivity-type drift region. The semiconductor device may include a plurality of trench portions that are provided spreading from an upper surface of the semiconductor substrate and reaching an inside of the semiconductor substrate and are provided extending in a predetermined direction of extension at the upper surface of the semiconductor substrate. The semiconductor device may include a mesa portion that is provided inside the semiconductor substrate and is sandwiched by two of the trench portions. The semiconductor device may include a first conductivity-type emitter region that is provided in the mesa portion and between the upper surface of the semiconductor substrate and the drift region and has a doping concentration higher than that of the drift region, The semiconductor device may include a second conductivity-type contact region provided in the mesa portion and between the upper surface of the semiconductor substrate and the drift region. In a cross-section that is parallel with the direction of extension and perpendicular to the upper surface of the semiconductor substrate, an inclination of a cross-section boundary between the contact region and the emitter region relative to the upper surface of the semiconductor substrate may be equal to or larger than 70 degrees and equal to or smaller than 110 degrees.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one of the directions parallel with the depth direction of a semiconductor substrate is referred to as the "upward" direction and the other direction is referred to as the "downward" direction. Among the two principal surfaces of a substrate, a layer or another member, one of the surfaces is referred to as the upper surface and the other surface is referred to as the lower surface. The "upward" and "downward" directions are not limited to the direction of gravity or the direction of attachment to a substrate or the like at the time of implementation of a semiconductor device.

In the present specification, technical matters are explained in some cases using orthogonal coordinate axes which are an X-axis, a Y-axis and a Z-axis. In the present specification, a plane parallel with the upper surface of a semiconductor substrate is treated as an XY-plane, and the depth direction perpendicular to the upper surface of the semiconductor substrate is treated as the Z-axis.

Although in each example shown, the first conductivity-type is N-type, and the second conductivity-type is P-type, the first conductivity-type may alternatively be P-type, and the second conductivity-type may alternatively be N-type. In this case, conductivity types of substrates, layers, regions and the like in each example become opposite polarities, respectively.

Figure 1:
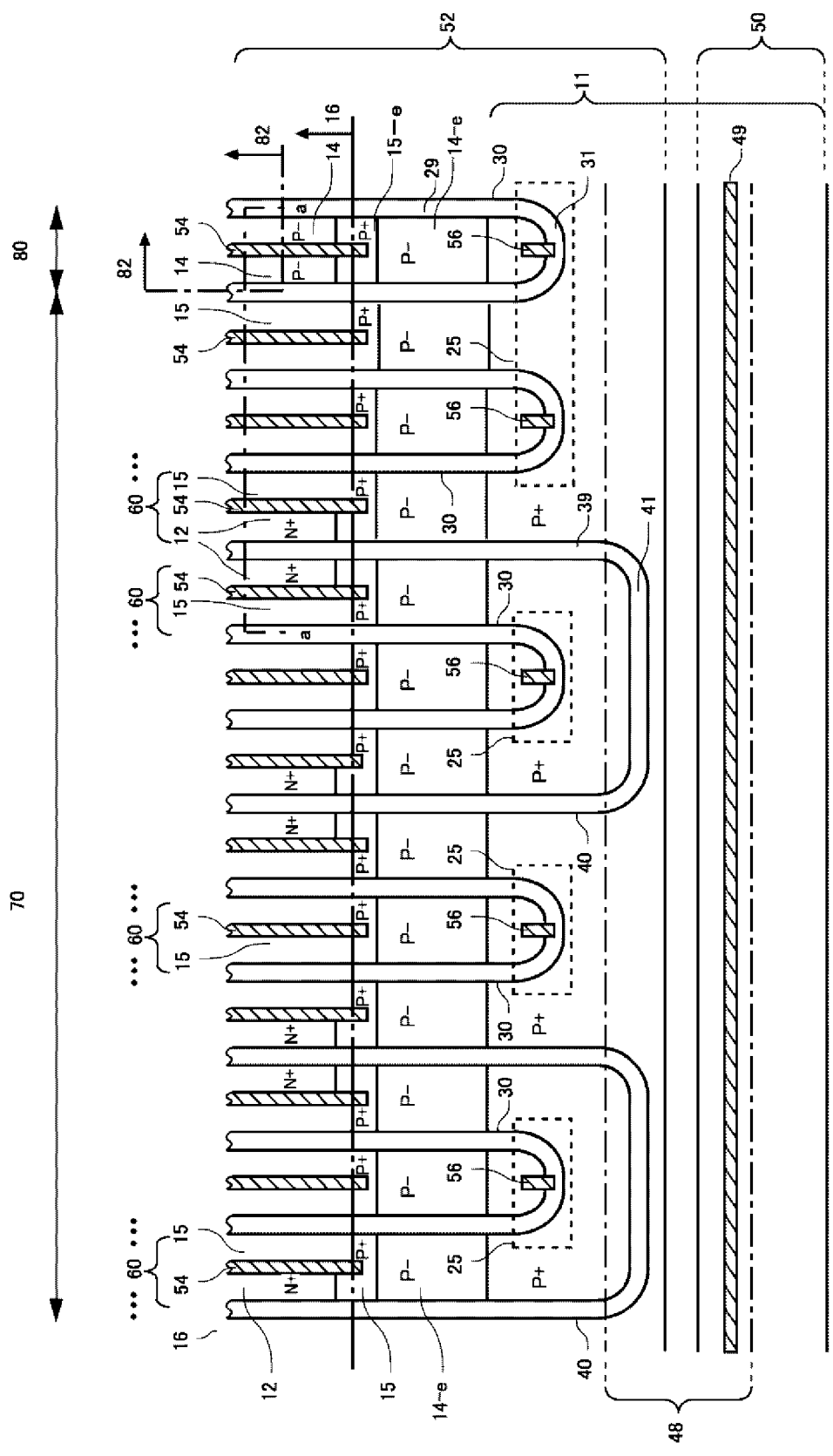
FIG. 1 is a figure showing part of the upper surface of a semiconductor device 100 according to an embodiment of the present invention.

FIG. 1 is a figure showing part of the upper surface of a semiconductor device 100 according to an embodiment of the present invention. The semiconductor device 100 of the present example is a semiconductor chip including a transistor portion 70 and a diode portion 80. The transistor portion 70 includes a transistor such as an IGBT. The diode portion 80 is provided adjacent to the transistor portion 70 at the upper surface of a semiconductor substrate and includes a diode such as a FWD (Free Wheel Diode). In FIG. 1, the chip upper surface around a chip end portion is shown, and other regions are omitted.

In addition, in FIG. 1, an active region of the semiconductor substrate in the semiconductor device 100 is shown. The semiconductor device 100 may have an edge termination structure portion surrounding the active region. The active region refers to a region where current flows if the semiconductor device 100 is controlled to be in an ON-state. The edge termination structure portion relaxes electric field crowding on the upper surface side of the semiconductor substrate. The edge termination structure portion has, for example, a guard ring, a field plate, a RESURF or a structure obtained by combining them.

The semiconductor device 100 of the present example includes gate trench portions 40, dummy trench portions 30, a well region 11, emitter regions 12, base regions 14 and contact regions 15 that are provided inside the semiconductor substrate and are exposed to the upper surface of the semiconductor substrate. In addition, the semiconductor device 100 of the present example includes an emitter electrode 52 and a gate electrode 50 that are provided above the upper surface of the semiconductor substrate. The emitter electrode 52 and the gate electrode 50 are provided separated from each other.

An interlayer dielectric film is provided between the emitter electrode 52 and gate electrode 50 and the upper surface of the semiconductor substrate. In FIG. 1, indication of the interlayer dielectric film is omitted. The interlayer dielectric film of the present example is provided with contact holes 56, contact holes 49 and contact holes 54 that penetrate the interlayer dielectric film.

The emitter electrode 52 passes through the contact holes 54 and contact the emitter regions 12, contact regions 15 and base regions 14 at the upper surface of the semiconductor substrate. In addition, the emitter electrode 52 passes through the contact holes 56 and are connected with dummy conductive portions in the dummy trench portions 30. Connecting portions 25 formed of a conductive material such as polysilicon doped with impurities may be provided between the emitter electrode 52 and the dummy conductive portions. An insulating film such as an oxide film is provided between the connecting portion 25 and the upper surface of the semiconductor substrate.

The gate electrode 50 passes through the contact hole 49 and contacts a gate runner 48. The gate runner 48 is formed of polysilicon doped with impurities or the like. At the upper surface of the semiconductor substrate, the gate runner 48 is connected with gate conductive portions in the gate trench portions 40. The gate runner 48 is not connected with the dummy conductive portions in the dummy trench portions 30. The gate runner 48 of the present example is provided spreading from below the contact hole 49 and reaching edge portions of the gate trench portion 40. An insulating film such as an oxide film is provided between the gate runner 48 and the upper surface of the semiconductor substrate. At the edge portions of the gate trench portions 40, the gate conductive portions are exposed to the upper surface of the semiconductor substrate and contact the gate runner 48.

The emitter electrode 52 and the gate electrode 50 are formed of metal-containing materials. For example, at least a partial region of each electrode is formed of aluminum or an aluminum-silicon alloy. Each electrode may have a barrier metal formed of titanium, a titanium compound or the like at a layer underlying the region formed of aluminum or the like, and may alternatively have a plug formed of tungsten or the like in a contact hole.

One or more gate trench portions 40 and one or more dummy trench portions 30 are arrayed at predetermined intervals along a predetermined array direction (the Y-axis direction in the present example) in the region of the transistor portion 70. In the transistor portion 70, one or more gate trench portions 40 and one or more dummy trench portions 30 may be provided alternately along the array direction.

A gate trench portion 40 of the present example may have two extending portions 39 extending along a direction of extension (the X-axis direction in the present example) parallel with the upper surface of the semiconductor substrate and perpendicular to the array direction, and a connection portion 41 connecting the two extending portions 39. At least part of the connection portion 41 is preferably formed into a curved line form. By connecting end portions of the two extending portions 39 of the gate trench portion 40, electric field crowding at the end portions of the extending portions 39 can be relaxed. The gate runner 48 may connect with a gate conductive portion at the connection portion 41 of the gate trench portion 40.

Dummy trench portions 30 of the present example are provided between the respective extending portions 39 of the gate trench portions 40. Similar to the gate trench portions 40, the dummy trench portions 30 may have U-shapes at the upper surface of the semiconductor substrate 10. That is, a dummy trench portion 30 of the present example has two extending portions 29 extending along the direction of extension and a connection portion 31 connecting the two extending portions 29. In another example, a dummy trench portion 30 may not have a connection portion 31, but alternatively have a straight line shape extending in the direction of extension.

In the diode portion 80, a plurality of dummy trench portions 30 are arrayed continuously. In addition, also in a region that is part of the transistor portion 70 and is adjacent to the diode portion 80, a plurality of dummy trench portions 30 may be arrayed continuously. In the present example, straight line-like extending portions (31, 29) of each trench portion are treated as one trench portion.

The emitter electrode 52 is provided above the gate trench portions 40, the dummy trench portions 30, the well region 11, the emitter regions 12, the base regions 14 and the contact regions 15. The well region 11 is of a second conductivity-type, and is provided in a predetermined range spreading from an end portion of an active region on the side where the gate electrode 50 is provided. The depth of diffusion of the well region 11 may be deeper than the depths of the gate trench portions 40 and dummy trench portions 30. Partial regions, on the gate electrode 50 side, of the gate trench portions 40 and the dummy trench portions 30 are provided in the well region 11. The bottoms at ends of the dummy trench portions 30 in the direction of extension may be covered by the well region 11.

The base regions 14 are provided in mesa portions 60 sandwiched by respective trench portions. The base regions 14 are of a second conductivity-type having a doping concentration lower than that of the well region 11. The base regions 14 of the present example are of P−-type. A mesa portion 60 may be a portion that is part of the semiconductor substrate and is sandwiched by two adjacent trench portions, and may be a portion spreading from the upper surface of the semiconductor substrate and reaching the depth of a deepest bottom portion of the respective trench portions. In the present example, base regions 14-*e* are arranged at both end portions of each mesa portion 60 in the X-axis direction (in FIG. 1, only one of the end portions in the X-axis direction is shown).

The upper surfaces of the mesa portions 60 are selectively provided with the second conductivity-type contact regions 15 having a doping concentration higher than that of the base regions 14. The contact regions 15 of the present example are of P+-type. In addition, the upper surfaces of the mesa portions 60 of the transistor portion 70 are selectively provided with the first conductivity-type emitter regions 12 having a doping concentration higher than that of the semiconductor substrate. The emitter regions 12 of the present example are of N+-type.

The emitter regions 12 are provided adjacent to the gate trench portions 40 at the upper surfaces of the mesa portions 60. The emitter regions 12 may be provided adjacent to or may alternatively be provided separated from the dummy trench portions 30 at the upper surfaces of the mesa portions 60. The emitter regions 12 in the example of FIG. 1 are not adjacent to the dummy trench portions 30.

The contact regions 15 of the transistor portion 70 are provided adjacent to the dummy trench portions 30 at the upper surfaces of the mesa portions 60. The contact regions 15 may be provided adjacent to or may alternatively be provided separated from the gate trench portions 40 at the upper surfaces of the mesa portions 60. The contact regions 15 in the example of FIG. 1 are adjacent to the gate trench portions 40 at end portions of the contact regions 15 in the X-axis direction. Each of the emitter regions 12 and the contact regions 15 has a portion exposed through a contact hole 54.

At least either the emitter regions 12 or the contact regions 15 in the transistor portion 70 is provided in a stripe shape extending in the direction of extension (X-axis direction) of the trench portions at the upper surface of the semiconductor substrate. The stripe shape refers to that the length of a trench portion in the direction of extension (X-axis direction) is longer than the width of the trench portion in the array direction (Y-axis direction). The length and width may refer to the maximum length and maximum width in the X-axis direction and Y-axis direction. The stripe shape may refer to a shape the length of which is equal to or longer than 200% of the width, may refer to a shape the length of which is equal to or longer than 400% of the width or may alternatively refer to a shape the length of which is equal to or longer than 1,000% of the width.

In the example of FIG. 1, one emitter region 12 and one contact region 15 in stripe-like forms are provided in each mesa portion 60 of the transistor portion 70. In another example, at least either the emitter regions 12 or the contact regions 15 may alternatively be provided discretely in the X-axis direction. That is, a plurality of at least either the emitter regions 12 or the contact regions 15 may alternatively be provided separated from each other in the X-axis direction.

A mesa portion 60 of the diode portion 80 of the present example is not provided with an emitter region 12. The mesa portion 60 of the diode portion 80 is provided with a contact region 15 or a base region 14 spreading from one of dummy trench portions 30 sandwiching the mesa portion 60 and reaching the other dummy trench portion 30. That is, at the upper surface of the semiconductor substrate, the width of the mesa portion 60 of the diode portion 80 in the Y-axis direction and the width of the contact region 15 or base region 14 provided to the mesa portion 60 of the diode portion 80 in the Y-axis direction are the same.

As one example, the mesa portion 60 that is in the diode portion 80 and is adjacent to the transistor portion 70 is provided with a contact region 15 over the entire region sandwiched by base regions 14-e. Likewise, the mesa portion 60 that is in the transistor portion 70 and adjacent to the diode portion 80 may be provided with a contact region 15 over the entire region sandwiched by base regions 14-e. A mesa portion 60 that is in the diode portion 80, but not adjacent to the transistor portion 70 may be provided with a contact region 15 having an area of exposure to the upper surface of the semiconductor substrate that is smaller than that of the contact region 15 of the mesa portion 60 adjacent to the transistor portion 70. As one example, a mesa portion 60 that is in the diode portion 80, but not adjacent to the transistor portion 70 is provided with contact regions 15-e at both end portions, in the X-axis direction, of a region sandwiched by base regions 14-e, and the entire region sandwiched by the contact regions 15-e is provided with a base region 14.

In the transistor portion 70, contact holes 54 are provided above respective regions of the contact regions 15 and the emitter regions 12. In the diode portion 80, a contact hole 54 is provided above the contact region 15 and the base region 14. None of the contact holes 54 are arranged above the well region 11 and the base regions 14-e that are arranged at both ends of the mesa portions 60 in the X-axis direction.

The semiconductor device 100 has a first conductivity-type accumulation region 16 provided inside the semiconductor substrate and selectively below the base regions 14. In FIG. 1, the range provided with the accumulation region 16 is indicated with a chain line. In addition, the diode portion 80 has a first conductivity-type cathode region 82 in a region that is on the lower surface side of the semiconductor substrate. In FIG. 1, the range provided with the cathode region 82 is indicated with a chain line. In the region on the lower surface side of the semiconductor substrate, the region not provided with the cathode region 82 may be provided with a second conductivity-type collector region.

Figure 2:
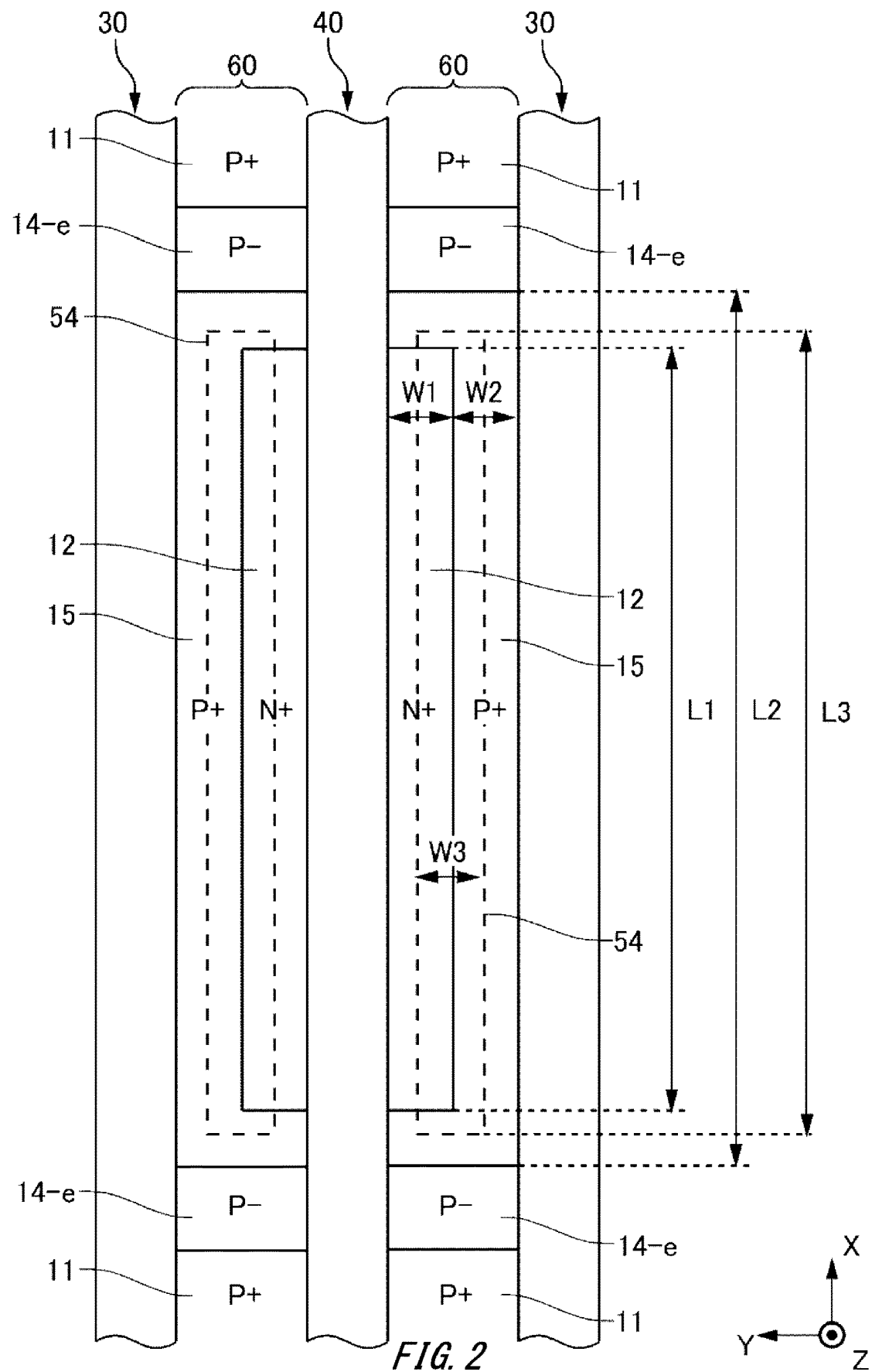
FIG. 2 is a top view showing example emitter regions 12 and contact regions 15 in two mesa portions 60 in a transistor portion 70.

FIG. 2 is a top view showing example emitter regions 12 and contact regions 15 in two mesa portions 60 in the transistor portion 70. The two mesa portions 60 of the present example are mesa portions 60 sandwiched by a gate trench portion 40 and dummy trench portions 30.

In the example of FIG. 2, both the emitter regions 12 and the contact regions 15 have stripe shapes. The emitter regions 12 are arranged along the gate trench portion 40. A length L1 of the emitter regions 12 of the present example in the X-axis direction is shorter than a length L2 of the region provided with the emitter regions 12 and the contact regions 15 (in the present example, the region sandwiched by two base regions 14-e). The emitter regions 12 of the present example have both ends in the X-axis direction that are arranged separated from the base regions 14-e. The emitter regions 12 of another example may alternatively have both ends in the X-axis direction contacting the base regions 14-e. The length L1 of the emitter regions 12 may be longer than 50% of the length L2, may be equal to or longer than 80% of the length L2 or may alternatively be 100% of the length L2.

The contact regions 15 of the present example are arranged along the dummy trench portions 30. The length of the contact regions 15 of the present example in the X-axis direction is L2. The contact regions 15 of the present example have both ends in the X-axis direction contacting the base regions 14-e. In addition, the regions between the emitter regions 12 and the base regions 14-e are also provided with contact regions 15. The contact regions 15 of another example may alternatively have both ends in the X-axis direction that are separated from the base regions 14-e. In this case, emitter regions 12 may be provided between the contact regions 15 and the base regions 14-e. The length of the contact regions 15 in the X-axis direction may be longer than 50% of the length L2, may be equal to or longer than 80% of the length L2 or may alternatively be 100% of the length L2.

In FIG. 2, the positions at which contact holes 54 are arranged are indicated with broken lines. A length L3 of the contact holes 54 in the X-axis direction may be longer than the length L1. The length L3 may be shorter than the length L2. Both ends of the contact holes 54 in the X-axis direction may be in the contact regions 15.

In addition, in the example of FIG. 2, a width W1 of the emitter regions 12 in the Y-axis direction is half a width W1+W2 of the mesa portions 60. The width W2 of a contact region 15 at a portion sandwiched by an emitter region 12 and a mesa portion 60 may be the same as the width W1 of the emitter regions 12. The width W1 and the width W2 being the same may mean the width W1 being in the range of 40% of the width W2 or larger and 60% of the width W2 or smaller. In another example, the width W1 of the emitter regions 12 in the Y-axis direction may alternatively be smaller than the width W1+W2 of the mesa portions 60. The width W1 of the emitter regions 12 in the Y-axis direction may alternatively be smaller than the width W2 of the contact regions 15 in the Y-axis direction. A width W3 of the contact holes 54 in the Y-axis direction may be larger than the width W1.

The structure shown in FIG. 1 and FIG. 2 allows increase in the length of emitter regions 12 adjacent to gate trench portions 40. Because of this, the channel area can be increased, and saturation current of the semiconductor device 100 can be increased. In addition, if carriers such as holes accumulated inside the semiconductor substrate are to be extracted to the emitter electrode 52 at the time of turn-OFF or the like of the semiconductor device 100, carriers that are present below emitter regions 12 migrate in base regions 14 along the lower surfaces of the emitter regions 12 toward contact regions 15. If the distance of migration along the lower surfaces of the emitter regions 12 increase, the distance of migration in the base regions 14 with a relatively high resistance increases, and latch-up occurs, in some cases. In the present example, the distance of migration of the carriers is approximately the width W1 of the emitter regions 12 at most, the carriers can be extracted efficiently. Because of this, latch-up can be suppressed.

Figure 3:
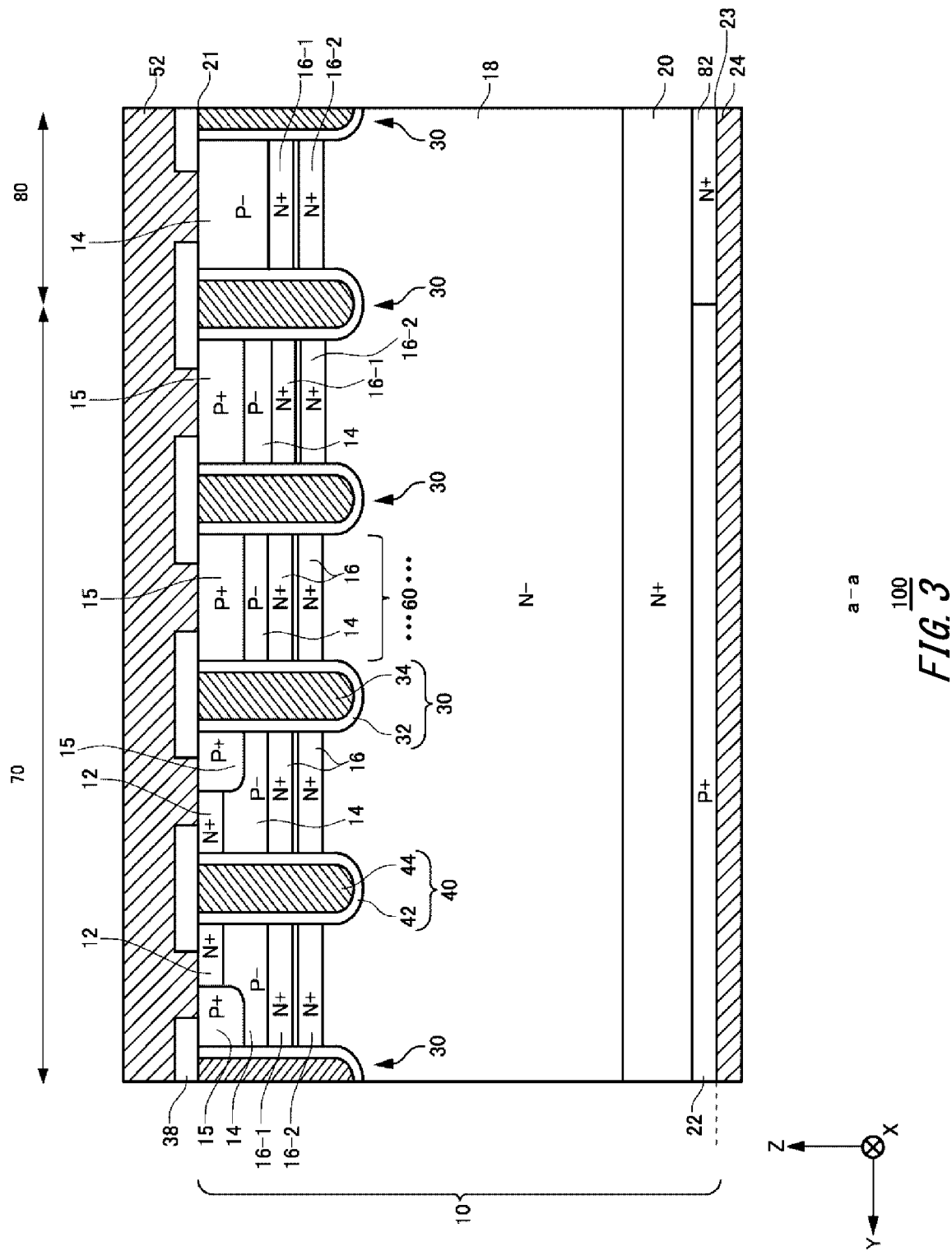
FIG. 3 is a figure showing an example cross-section taken along a-a in FIG. 1.

FIG. 3 is a figure showing an example cross-section taken along a-a in FIG. 1. The cross-section taken along a-a is a YZ plane passing through emitter regions 12. The semiconductor device 100 of the present example has, in the cross-section, the semiconductor substrate 10, an interlayer dielectric film 38, the emitter electrode 52 and a collector electrode 24. The emitter electrode 52 is provided at the upper surfaces of the semiconductor substrate 10 and interlayer dielectric film 38.

The collector electrode 24 is provided at a lower surface 23 of the semiconductor substrate 10. The emitter electrode 52 and the collector electrode 24 are formed of conductive materials such as metal. In the present specification, the direction linking the emitter electrode 52 and the collector electrode 24 is referred to as the depth direction (Z-axis direction).

The semiconductor substrate 10 may be a silicon substrate, may be a silicon carbide substrate or may alternatively be a nitride semiconductor substrate such as a gallium nitride substrate or the like. The semiconductor substrate 10 of the present example is a silicon substrate. The semiconductor substrate 10 includes a first conductivity-type drift region 18. The drift region 18 of the present example is of N−-type. The drift region 18 may be a region that is left free of other doping regions not being formed therein.

The semiconductor substrate 10 is provided with base regions 14 between an upper surface 21 of the semiconductor substrate 10 and the drift region 18. The base regions 14 of the present example are of P−-type having a doping concentration lower than that of contact regions 15. Gate trench portions 40 and dummy trench portions 30 are provided spreading from the upper surface 21 of the semiconductor substrate 10, penetrating the base regions 14 and reaching the inside of the semiconductor substrate 10 (the drift region 18 in the present example). As mentioned above, mesa portions 60 are regions that are inside the semiconductor substrate 10 and sandwiched by the gate trench portions 40 and the dummy trench portions 30. The respective mesa portions 60 may be provided with base regions 14.

In the cross-section, mesa portions 60 of the transistor portion 70 are provided with emitter regions 12 and contact regions 15. The emitter regions 12 are provided inside the mesa portions 60 and between the upper surface 21 of the semiconductor substrate 10 and the drift region 18. The emitter regions 12 of the present example are provided in regions adjacent to the gate trench portion 40 and between the base regions 14 and the upper surface 21 of the semiconductor substrate 10.

The contact regions 15 are provided inside the mesa portions 60 and between the upper surface 21 of the semiconductor substrate 10 and the drift region 18. The contact regions 15 of the present example are provided in regions adjacent to the dummy trench portions 30 and between the base regions 14 and the upper surface 21 of the semiconductor substrate 10.

A mesa portion 60 that is among mesa portions 60 of the transistor portion 70 and is adjacent to the diode portion 80 may not be provided with an emitter region 12, but may be provided with a contact region 15 adjacent to both the two dummy trench portions 30. The other structures of the mesa portion 60 are the same as those of other mesa portions 60.

In the cross-section, a mesa portion 60 of the diode portion 80 is provided with a base region 14. In the present example, in the cross-section of the mesa portion 60 of the diode portion 80, none of contact regions 15 and emitter regions 12 is provided. A mesa portion 60 that is among mesa portions 60 of the diode portion 80 and is adjacent to the transistor portion 70 may be provided with a contact region 15 between a base region 14 and the upper surface 21 of the semiconductor substrate 10.

In the present example, in each mesa portion 60, an N+-type accumulation region 16 having a doping concentration higher than that of the drift region 18 is provided between a base region 14 and the drift region 18. The accumulation region 16 may be arranged above the lower end of each trench portion.

In addition, each mesa portion 60 may alternatively be provided with a first accumulation region 16-1 and a second accumulation region 16-2. The first accumulation region 16-1 and the second accumulation region 16-2 are provided at different positions in the depth direction perpendicular to the upper surface of the semiconductor substrate 10. The respective accumulation regions 16 have peaks at different positions in the doping concentration distribution in the depth direction. In the present specification, the first accumulation region 16-1 and the second accumulation region 16-2 are simply referred to as an accumulation region 16, in some cases. An accumulation region 16 may be provided to cover the entire lower surface of a base region 14 in a mesa portion 60.

By providing an accumulation region 16, the carrier injection-enhancement effect (IE effect) can be enhanced, and the ON-voltage can be lowered. In addition, by providing two accumulation regions 16 at different depth positions, electron current having passed through a channel region adjacent to a gate trench portion 40 in each base region 14 can be caused to flow through portions near the middle of a mesa portion 60 in the Y-axis direction. Because of this, displacement current to flow from portions near the lower end of a dummy trench portion 30 at the time of turn-ON toward the gate trench portion 40 side can be suppressed, and power loss at the time of turn-ON can be reduced. Suppression of displacement current is mentioned about below.

In both the transistor portion 70 and the diode portion 80, an N+-type buffer region 20 is provided below the drift region 18. The doping concentration of the buffer region 20 is higher than the doping concentration of the drift region 18. The buffer region 20 may function as a field stop layer to prevent a depletion layer spreading from the lower surface side of base regions 14 from reaching a P+-type collector region 22 and the N+-type cathode region 82.

In the transistor portion 70, the P+-type collector region 22 is provided below the buffer region 20. In the diode portion 80, the N+-type cathode region 82 is provided below the buffer region 20. As one example, the diode portion 80 is a region that overlaps the cathode region 82 in a direction perpendicular to the lower surface 23 of the semiconductor substrate 10. In addition, the transistor portion 70 is a region: that is in a region that overlaps the collector region 22 in a direction perpendicular to the lower surface 23 of the semiconductor substrate 10; and where a predetermined unit configuration including an emitter region 12 and a contact region 15 are orderly arranged.

The upper surface 21 of the semiconductor substrate 10 is provided with one or more gate trench portions 40 and one or more dummy trench portions 30. Each trench portion extends from the upper surface 21 of the semiconductor substrate 10, penetrates base regions 14 and reaches the drift region 18. In a region provided with at least any of the emitter regions 12, contact regions 15 and accumulation regions 16, each trench portion penetrates also these regions and reaches the drift region 18. A trench portion being penetrating doping regions is not limited to one that is manufactured by performing processes of forming the doping regions and forming the trench portion in this order. One that is manufactured by forming trench portions and then forming a doping region between the trench portions is also included in one in which a trench portion penetrates doping regions.

A gate trench portion 40 has a gate trench provided to the upper surface 21 of the semiconductor substrate 10, a gate insulating film 42 and a gate conductive portion 44. The gate insulating film 42 is provided covering the inner wall of the gate trench. The gate insulating film 42 may be formed by oxidizing or nitriding a semiconductor at the inner wall of the gate trench. The gate conductive portion 44 is provided on the inner side relative to the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 includes, in the depth direction, a region facing at least an adjacent base region 14, with the gate insulating film 42 being sandwiched therebetween. The gate trench portion 40 in the cross-section is covered by the interlayer dielectric film 38 at the upper surface of the semiconductor substrate 10. If a predetermined voltage is applied to the gate conductive portion 44, a channel is formed by an electron inversion layer at a surface layer of the interface of the base region 14 contacting the gate trench.

A dummy trench portion 30 may have the same structure as that of a gate trench portion 40 in the cross-section. A dummy trench portion 30 has a dummy trench provided on the upper surface side of the semiconductor substrate 10, a dummy insulating film 32 and a dummy conductive portion 34. The dummy insulating film 32 is provided covering the inner wall of the dummy trench. The dummy conductive portion 34 is provided inside the dummy trench and is provided on the inner side relative to the dummy insulating film 32. The dummy insulating film 32 insulates the dummy conductive portion 34 from the semiconductor substrate 10.

The dummy conductive portion 34 may be formed of the same material as that of the gate conductive portion 44. For example, the dummy conductive portion 34 is formed of a conductive material such as polysilicon. The dummy conductive portion 34 may have a length in the depth direction which is the same as that of the gate conductive portion 44. The dummy trench portion 30 in the cross-section is covered by the interlayer dielectric film 38 at the upper surface 21 of the semiconductor substrate 10. Bottom portions of dummy trench portions 30 and gate trench portions 40 may have downwardly convex curved surface forms (curved line forms in the cross-section).

Figure 4:
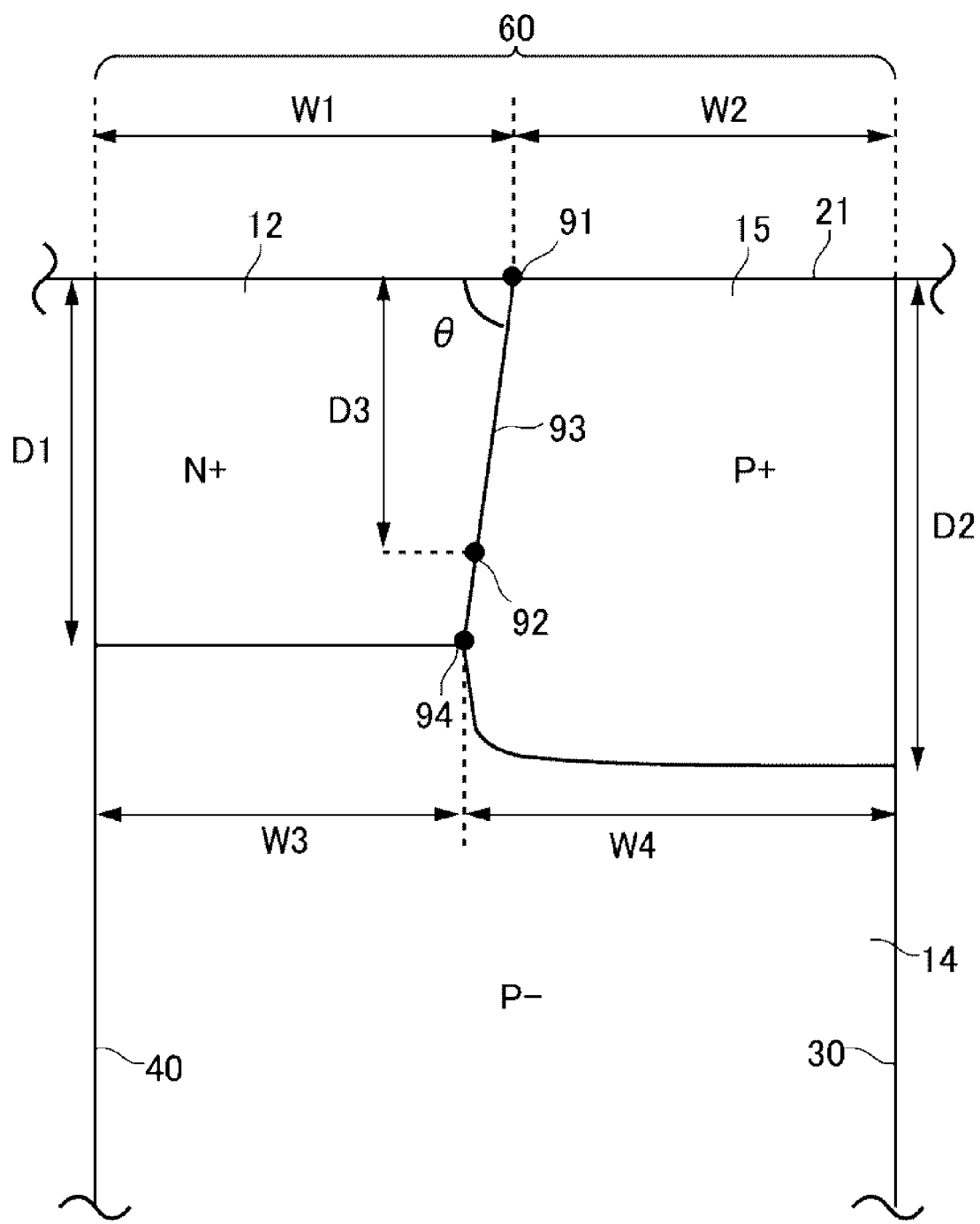
FIG. 4 is a cross-sectional view showing an example mesa portion 60 sandwiched by a gate trench portion 40 and a dummy trench portion 30.

FIG. 4 is a cross-sectional view showing an example mesa portion 60 sandwiched by a gate trench portion 40 and a dummy trench portion 30. The cross-section is a YZ plane perpendicular to the direction of extension of respective trench portions, emitter regions 12 and contact regions 15 at the upper surface 21 of the semiconductor substrate 10. The mesa portion 60 is provided with an emitter region 12 adjacent to the gate trench portion 40 and a contact region 15 adjacent to the dummy trench portion 30.

The contact region 15 may be provided reaching a position deeper than the emitter region 12 as seen from the upper surface 21 of the semiconductor substrate 10. That is, a depth D2 from the upper surface 21 to the lower end of the contact region 15 may be larger than a depth D1 from the upper surface 21 to the lower end of the emitter region 12. Such a configuration allows reduction in the area of the lower surface of the emitter region 12 as seen from the lower surface 23 of the semiconductor substrate 10. Because of this, at the time of turn-OFF or the like, the distance of migration, of carriers such as holes, along the lower surface of the emitter region 12 can be reduced. D2 may be equal to or larger than 120% of D1 or may alternatively be equal to or larger than 150% of D1. In addition, the width W3, in the Y-axis direction, of the lower surface of the emitter region 12 as seen from the lower surface 23 of the semiconductor substrate 10 may be smaller than a width W4 of the lower surface of the contact region 15, may be equal to or smaller than 75% of the width W4 or may alternatively be equal to or smaller than 50% of the width W4.

The contact region 15 and the emitter region 12 have a cross-section boundary 93 in the cross-section. An inclination $\theta$ formed by the cross-section boundary 93 and the upper surface 21 of the semiconductor substrate 10 may be equal to or larger than 70 degrees and equal to or smaller than 110 degrees. That is, the cross-section boundary 93 may be approximately perpendicular to the upper surface 21. The inclination $\theta$ may alternatively be equal to or larger than 80 degrees and equal to or smaller than 100 degrees. The inclination $\theta$ may alternatively be equal to or smaller than 90 degrees. Thereby, the area of the lower surface of the emitter region 12 and the area of the lower surface of the contact region 15 as seen from the lower surface 23 side of the semiconductor substrate 10 can be adjusted accurately. Because of this, it is possible to prevent the contact region 15 from covering the entire lower surface of the emitter region 12, while increasing the area of the lower surface of the contact region 15.

The inclination of the cross-section boundary 93 used may be the inclination, in a YZ plane, of a straight line linking an end portion 91 of the emitter region 12 at the upper surface 21 of the semiconductor substrate 10 and a point 92 on the cross-section boundary 93 at a predetermined depth position D3. The depth position D3 may be a point for example the distance of which from the upper surface 21 of the semiconductor substrate 10 is equal to or larger than 60% and equal to or smaller than 90% of the depth D1 of the emitter region 12. More specifically, the depth position D3 may be 60% of the depth D1, may be 70% of the depth D1, may be 80% of the depth D1 or may alternatively be 90% of the depth D1.

If the contact region 15 is provided at a deep position in the Z-axis direction along the dummy trench portion 30, the inter-collector-emitter capacitance increases. In addition, if the emitter region 12 is provided to be long along the X-axis direction along the gate trench portion 40, the inter-gate-emitter capacitance increases. Because the transconductance (Gm) can be increased by increasing the inter-gate-emitter capacitance, the saturation current density at the time when the semiconductor device is short-circuited can be increased. By adjusting these capacitances by adjusting the depth D2 of the contact region 15 and the length L1 of the emitter region 12, the semiconductor device 100 with predetermined capabilities can be provided.

Figure 5:
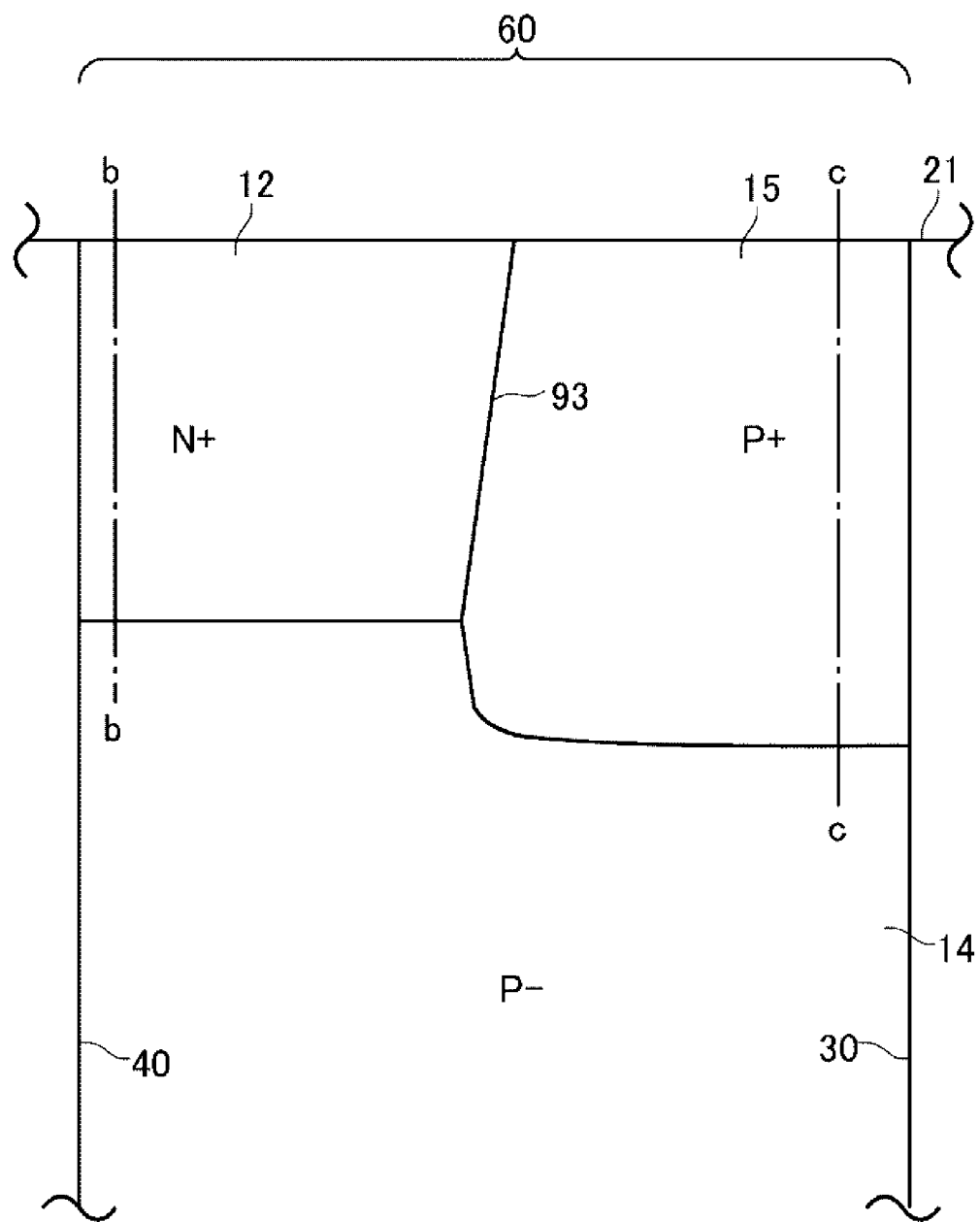
FIG. 5 is a cross-sectional view showing an example mesa portion 60 sandwiched by a gate trench portion 40 and a dummy trench portion 30.

FIG. 5 is a cross-sectional view showing an example mesa portion 60 sandwiched by a gate trench portion 40 and a dummy trench portion 30.

Figure 6:
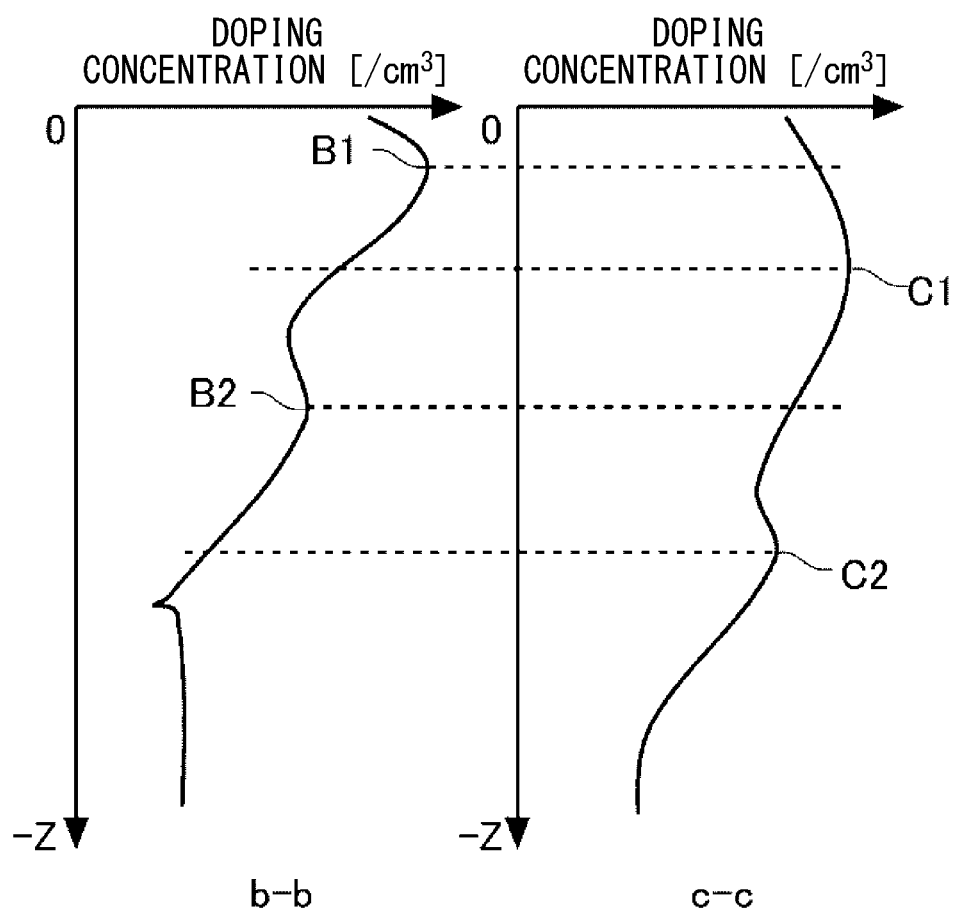
FIG. 6 is a figure showing an example doping concentration distribution of an emitter region 12 in a cross-section taken along b-b shown in FIG. 5 and an example doping concentration distribution of a contact region 15 in a cross-section taken along c-c shown in FIG. 5.

FIG. 6 is a figure showing an example doping concentration distribution of an emitter region 12 in a cross-section taken along b-b shown in FIG. 5 and an example doping concentration distribution of a contact region 15 in a cross-section taken along c-c shown in FIG. 5. In the present example, in the depth direction (Z-axis direction) perpendicular to the upper surface 21 of the semiconductor substrate 10, the doping concentration distribution of the contact region 15 has a plurality of peaks (C1, C2). In addition, in the depth direction (Z-axis direction) perpendicular to the upper surface 21 of the semiconductor substrate 10, the doping concentration distribution of the emitter region 12 has a plurality of peaks (B1, B2). The doping concentrations shown in FIG. 6 correspond to the concentration difference between donors and acceptors (net doping concentration).

Due to the doping concentration distribution having a plurality of peaks, respective doping regions can be formed to reach deeper positions. That is, by implanting impurities into the semiconductor substrate 10 multiple times while changing the range of impurity ions at the time of ion-implanting impurities, deep doping regions can be formed readily. For example, acceleration energy is controlled by changing the type of impurities to be implanted, the ion valence of impurities, accelerating voltage or the like, the range of impurities can be adjusted.

At the respective peak positions (C1, C2) of the doping concentration distribution of the contact region 15, dopants having the highest concentration may be the same type of dopant. As one example, the dopants are boron (B).

At any two peak positions of the doping concentration distribution of the emitter region 12, dopants having the highest concentration may be different types of dopant. For example, among the peaks of the doping concentration distribution of the emitter region 12, the dopant at the shallowest peak B1 is arsenic (As) and the dopant at the other peak B2 is phosphorus (P). Phosphorus may be implanted using a mask that is used when implanting arsenic.

If an N-type region is formed at a shallow position, the N-type region can be formed readily by using arsenic as the dopant. Note that if arsenic is to be implanted to a deep position of the semiconductor substrate 10, the accelerating voltage becomes too high. In contrast to this, a deep emitter region 12 can be formed readily by using phosphorus or the like as the dopant.

In addition, the respective peak positions (C1, C2) in the doping concentration distribution of the contact region 15 and the respective peak positions (B1, B2) in the doping concentration distribution of the emitter region 12 may be different. More specifically, the respective peak positions in the doping concentration distribution of the contact region 15 and the respective peak positions in the doping concentration distribution of the emitter region 12 may be arranged alternately in the depth direction. In the present example, the peak positions B1, C1, B2, C2 are arranged in this order from the upper surface 21 side of the semiconductor substrate 10. Such a structure allows suppression of diffusion of N-type and P-type dopants in the Y-axis direction across a long range in the depth direction. Because of this, the inclination of the cross-section boundary 93 can be controlled readily.

Figure 7:
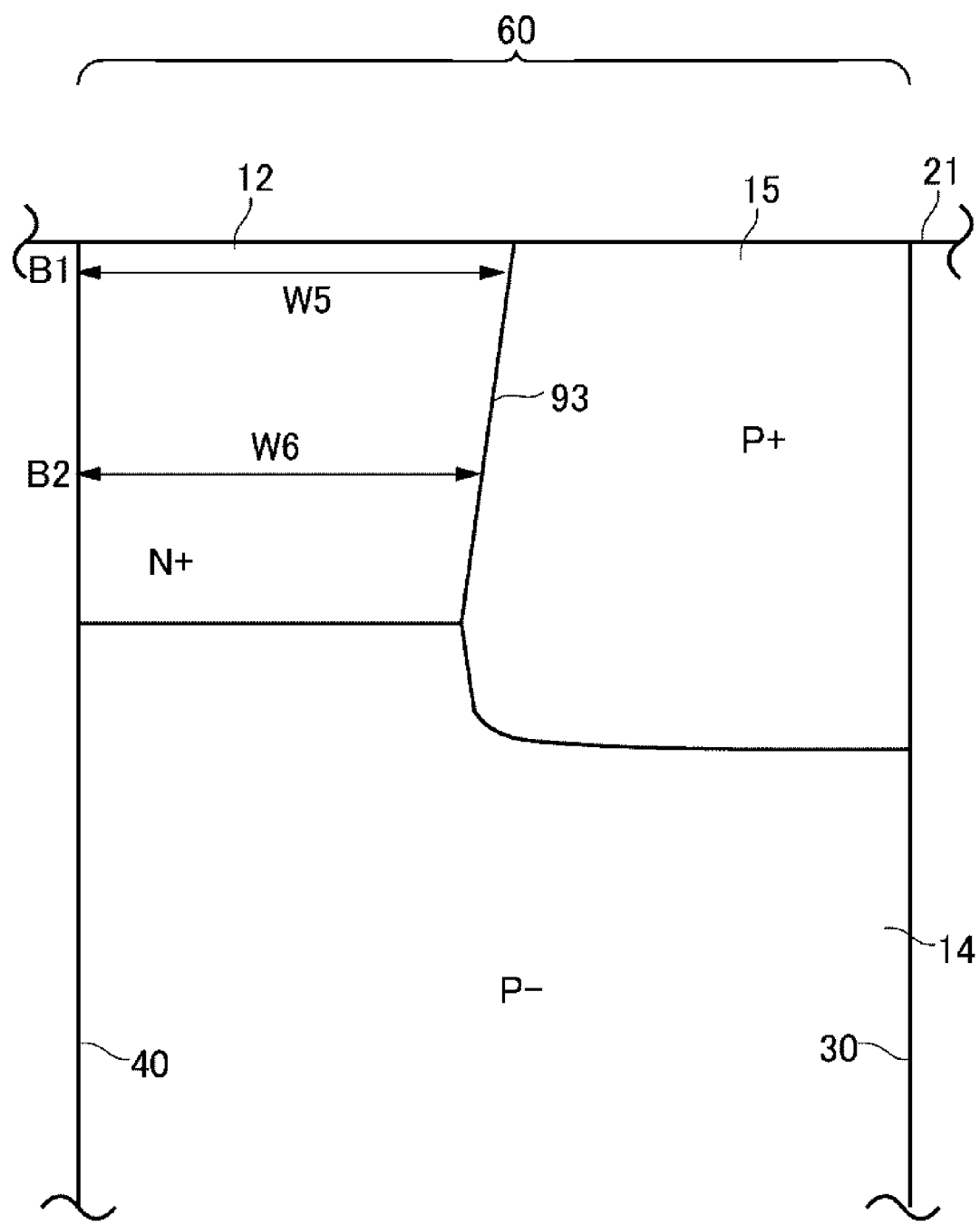
FIG. 7 is a cross-sectional view showing an example mesa portion 60 sandwiched by a gate trench portion 40 and a dummy trench portion 30.

FIG. 7 is a cross-sectional view showing an example mesa portion 60 sandwiched by a gate trench portion 40 and a dummy trench portion 30. The cross-section is a YZ plane. The widths of the emitter region 12 in the Y-axis direction at the respective peak positions B1, B2 shown in FIG. 6 are assumed to be W5, W6. The width W6 may be equal to or larger than 80% and equal to or smaller than 120% of the width W5, and may alternatively be equal to or larger than 90% and equal to or smaller than 110% of the width W5. In other cases, the width W6 may alternatively be equal to or larger than 80% and equal to or smaller than 90% of the width W5. By attaining the doping concentration distribution shown in FIG. 6, an emitter region 12 with uniform width in the Y-axis direction can be formed readily in a long range in the depth direction.

Figure 8:
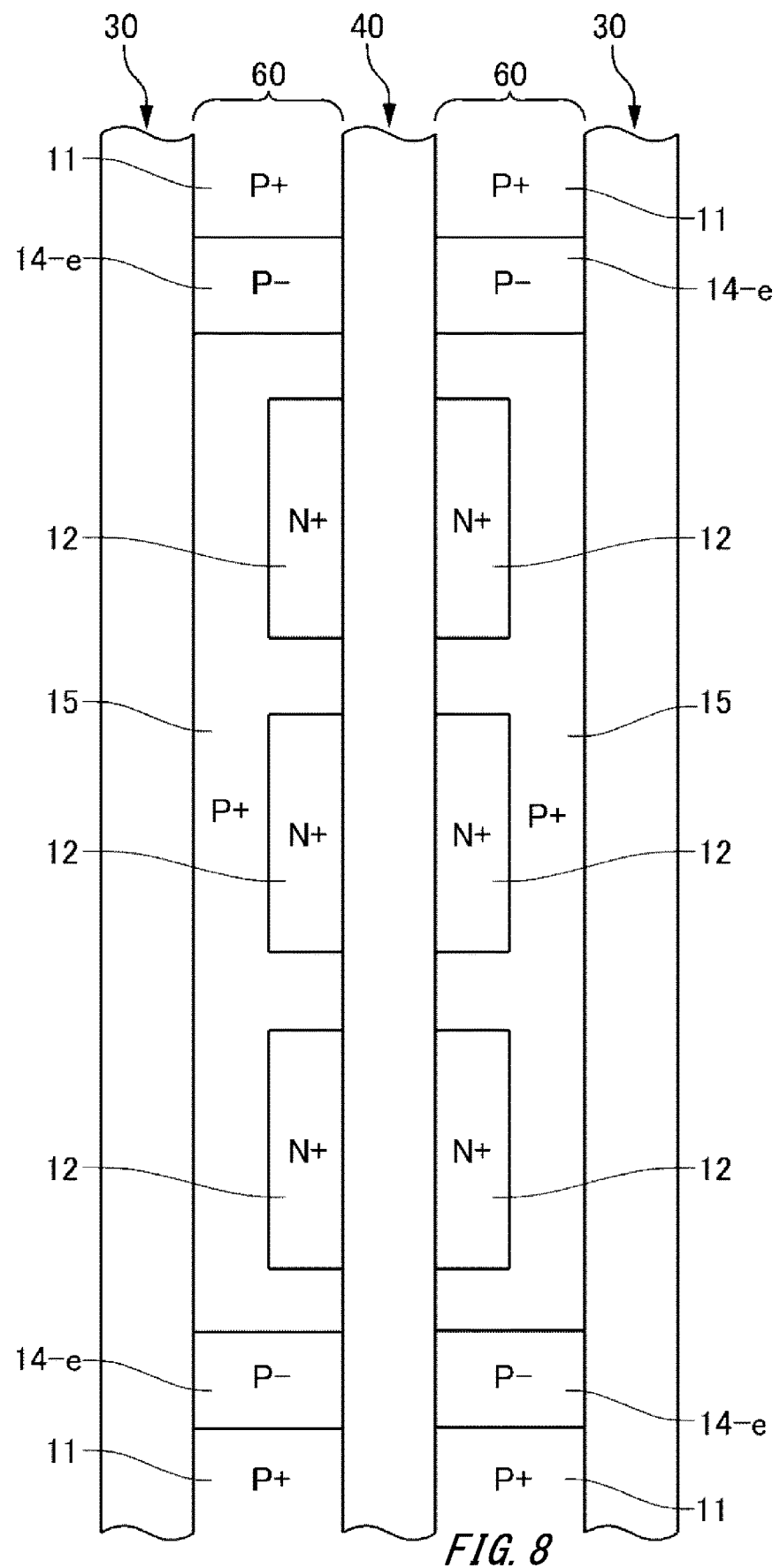
FIG. 8 is a top view showing other example emitter regions 12 and contact regions 15 in two mesa portions 60 in the transistor portion 70.

FIG. 8 is a top view showing other example emitter regions 12 and contact regions 15 in two mesa portions 60 in the transistor portion 70. In the present example, a plurality of the emitter regions 12 are arranged discretely in the X-axis direction. The respective emitter regions 12 have stripe shapes. The contact regions 15 may be arranged between the respective emitter regions 12. The other structures are the same as those in the example shown in FIG. 2.

Such a structure also allows increase in saturation current of the semiconductor device 100. In addition, latch-up of the semiconductor device 100 can be suppressed.

Figure 9:
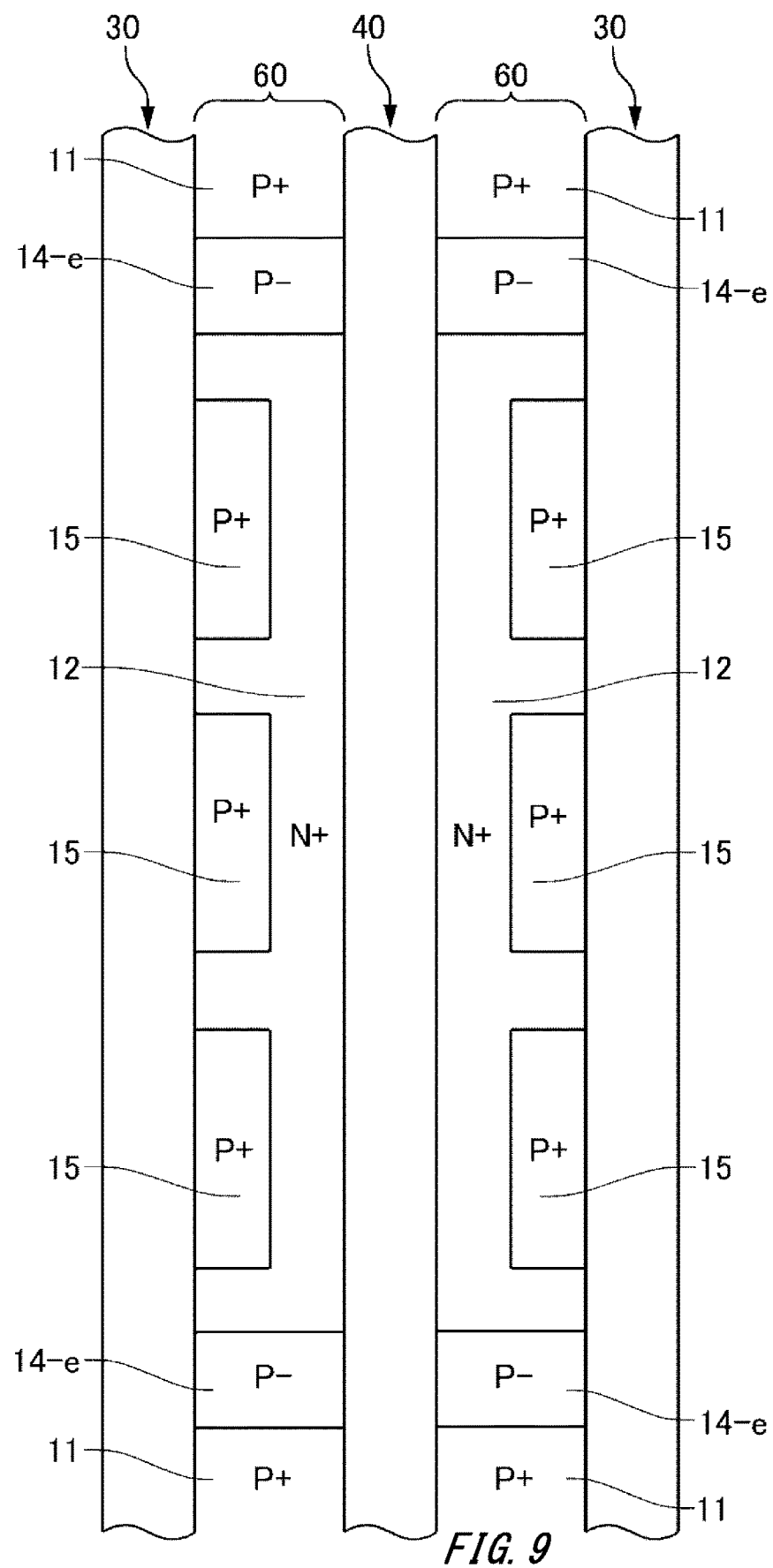
FIG. 9 is a top view showing other example emitter regions 12 and contact regions 15 in two mesa portions 60 in the transistor portion 70.

FIG. 9 is a top view showing other example emitter regions 12 and contact regions 15 in two mesa portions 60 in the transistor portion 70. In the present example, a plurality of the contact regions 15 are arranged discretely in the X-axis direction. The respective contact regions 15 have stripe shapes. The emitter regions 12 may be arranged between the respective contact regions 15. The other structures are the same as those in the example shown in FIG. 2. In addition, the emitter regions 12 may be arranged also between the contact regions 15 and base regions 14-e.

Such a structure also allows increase in saturation current of the semiconductor device 100. In addition, latch-up of the semiconductor device 100 can be suppressed.

Figure 10:
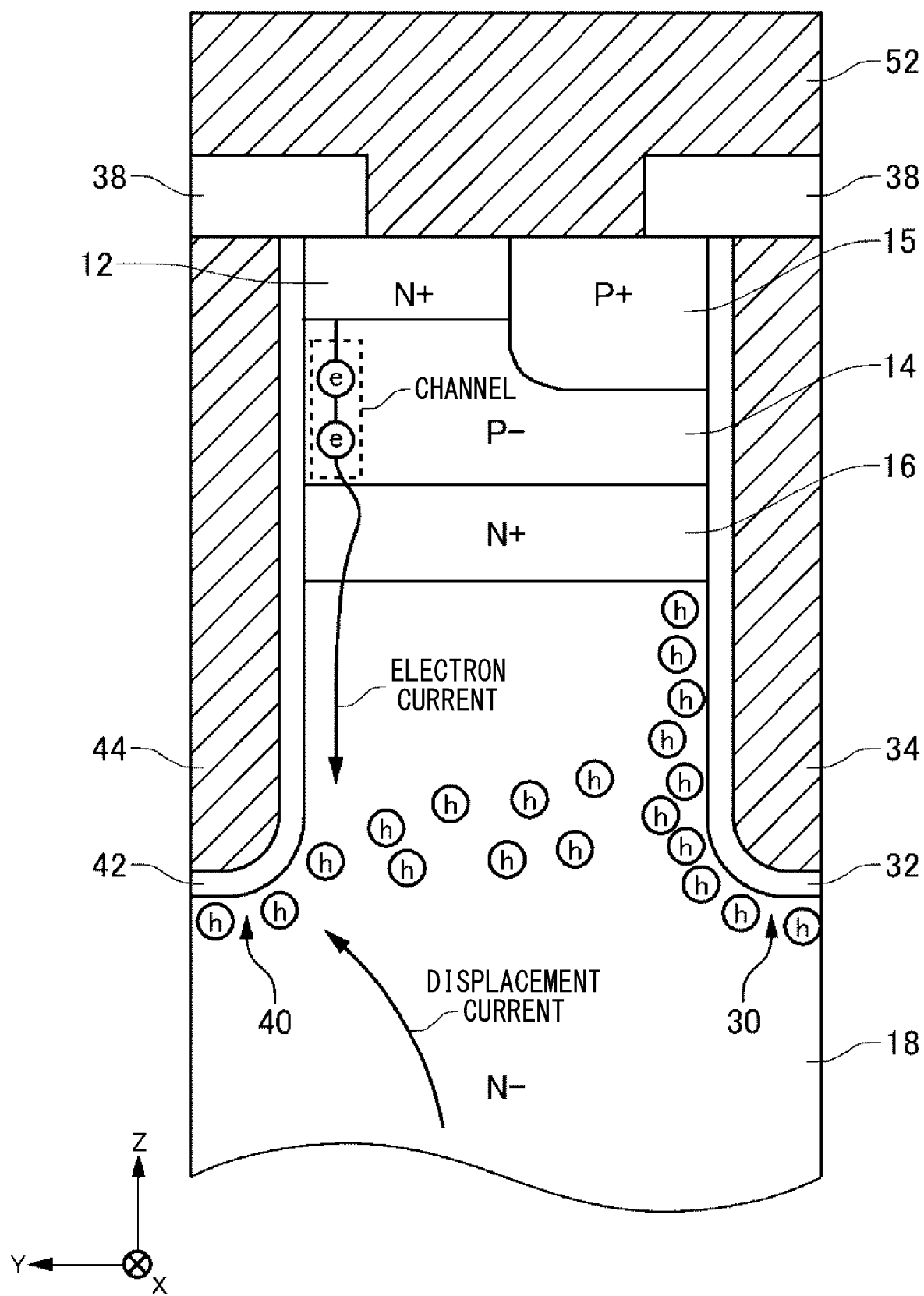
FIG. 10 is a figure showing example paths which are at portions near a mesa portion 60 and through which electron current and displacement current flow, in an example where there is only one accumulation region 16.

FIG. 10 is a figure showing example paths which are at portions near a mesa portion 60 and through which electron current and displacement current flow, in an example where there is only one accumulation region 16. In FIG. 10, current paths at the time of turn-ON are shown. At the time of turn-ON, voltage of the gate conductive portion 44 rises gradually from 0 [V]. Thereby, a channel is formed due to inducement of negative electric charges at portions that are in a base region 14 and are near a gate trench portion 40.

The main constituent of current during the initial period at the time of turn-ON is not hole current, but electron current. The "initial period" is a period that begins immediately before gate voltage Vge reaches threshold voltage and ends before a mirror period starts during which Vge becomes constant approximately at the value of the threshold voltage. If Vge becomes close to the threshold voltage, a channel begins to open, and injection of electrons into the drift region 18 begins.

In the example of FIG. 10, electrons that move downward from the channel might flow temporarily in the array direction in an accumulation region 16 (the Y-axis direction, or the direction from portions near the gate trench portion 40 toward the middle of the mesa portion 60). Note that because in the drift region 18 below the accumulation region 16, an electron accumulation layer is already formed in portions near the gate trench portion 40 (the threshold voltage for an N-type region at which an electron accumulation layer is formed is much lower than the threshold voltage for an inversion layer in a P-type region), the impedance in portions near the gate trench portion 40 is lower than that in the drift region 18. Therefore, electron current mainly flows through portions near the gate trench portion 40.

Once electrons reach the collector region 22 on the rear surface, injection of holes starts in a region spreading from the collector region 22 to the buffer region 20 and the drift region 18. Thereby, holes are accumulated at portions near the lower end of a trench portion. As one example, holes are present on the order of 1E+16 [cm$^{-3}$] in a region spreading from portions near the lower end of a gate trench portion 40 to a side portion of a dummy trench portion 30 below a first accumulation region 16.

Holes gather at the lower end of a gate trench portion 40 and the lower end of a dummy trench portion 30. In particular, because a dummy conductive portion 34 is at the same potential as the emitter electrode 52, it is easy for a hole inversion layer to be formed at the side wall of a dummy trench portion 30. Holes injected from the collector region 22 gather at portions near this hole inversion layer. Holes are distributed continuously from a dummy trench portion 30 to the lower end of a gate trench portion 40. Due to this hole distribution, a large displacement current flows to portions near the lower end of the gate trench portion 40 at the time of turn-ON.

Displacement current caused by accumulation of holes generates charging of the gate conductive portion 44 it faces, with the gate insulating film 42 being sandwiched therebetween. This charging of the gate conductive portion 44 causes an instantaneous increase in gate electrode Vge. The larger the displacement current is, the more the gate conductive portion 44 is charged, which leads to a more rapid increase in the potential of the gate conductive portion 44. As a result, the potential of the gate conductive portion 44 instantly exceeds the gate threshold.

Thereby, injection of a large amount of electrons and holes starts, and the inter-collector-emitter current increases. Corresponding to the ratio of change in current due to increase in the inter-collector-emitter current, the voltage reduction ratio of the inter-collector-emitter voltage (dV/dt) increases. The larger the displacement current is, the larger dV/dt is. In particular, the displacement current is large to the extent that accumulated holes do not flow to the emitter electrode 52, and an instantaneous increase in the potential of the gate conductive portion 44 becomes large. Therefore, in the example of FIG. 10, dV/dt becomes relatively large, and electromagnetic noises also become relatively large.

Figure 11:
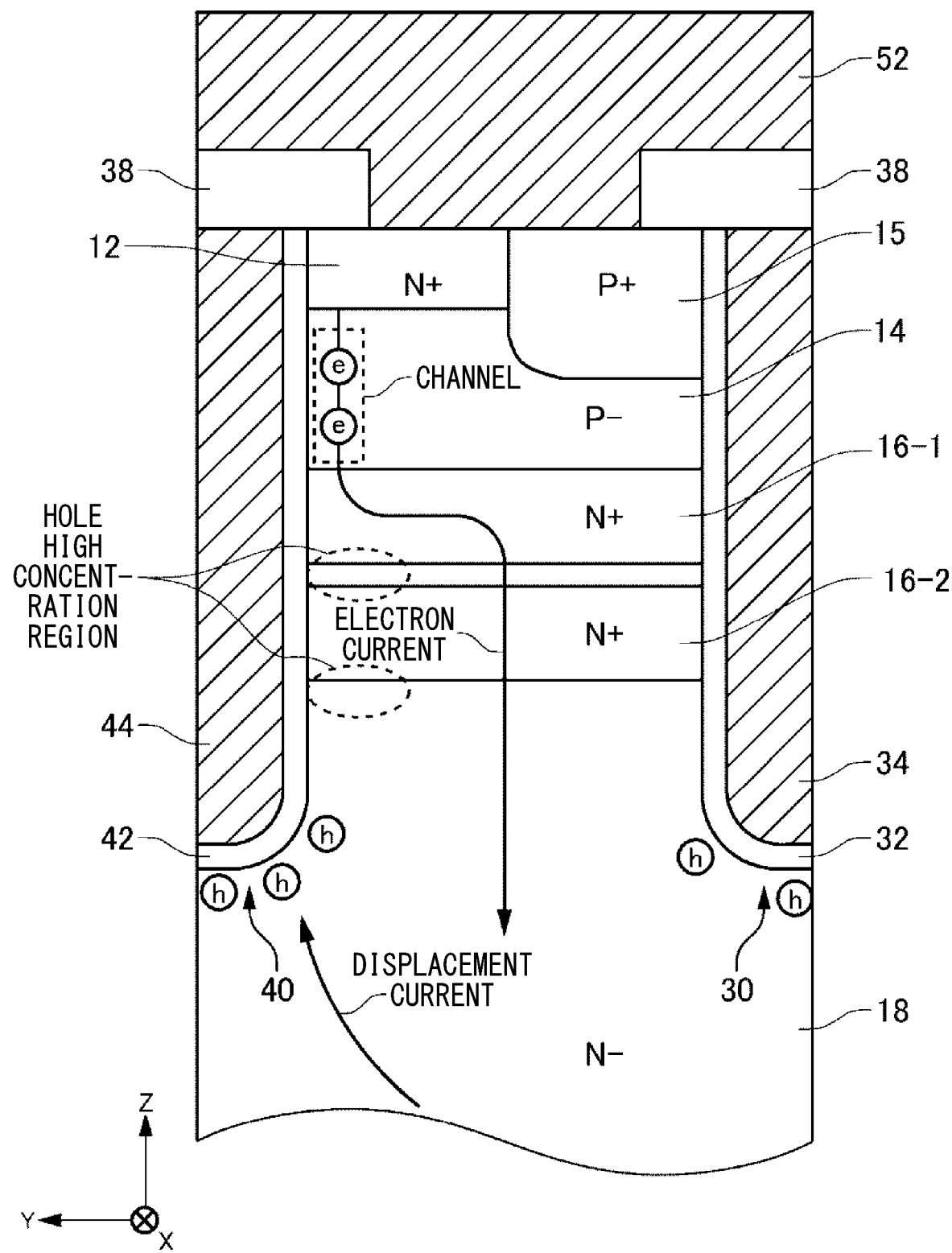
FIG. 11 is a figure showing electron current and displacement current at the time of turn-ON in the semiconductor device 100 including a first accumulation region 16-1 and a second accumulation region 16-2.

FIG. 11 is a figure showing electron current and displacement current at the time of turn-ON in the semiconductor device 100 including a first accumulation region 16-1 and a second accumulation region 16-2. In the present example also, electrons having passed through a channel almost head toward the array direction (Y-axis direction) in the first accumulation region 16-1. However, in the present example, the second accumulation region 16-2 is provided below the first accumulation region 16-1.

In the present example, the impedance for electron current is lower in the path to directly flow from the first accumulation region 16-1 to the second accumulation region 16-2 than in the path to return from portions near the middle of the first accumulation region 16-1 to portions near the gate trench portion 40, and flow to the second accumulation region 16-2. Among regions below the respective accumulation regions 16, holes are prone to accumulate in hole high concentration regions adjacent to gate trench portions 40. In addition, due to electron current being flowing not through portions near gate trench portions 40, but through portions near the middle of mesa portions 60, accumulation of holes in the hole high concentration regions is facilitated. Because of this, a flow of electron current through portions near the middle of the mesa portion 60 is facilitated. Although in FIG. 11, hole high concentration regions in which holes are accumulated are shown schematically, hole high concentration regions may alternatively be present only at portions near the boundaries between the gate trench portions 40 and the semiconductor substrate 10.

As mentioned above, the electron current of the present example does not return to portions near the gate trench portion 40, but advances downward in the vicinity of the middle of the mesa portion 60 sandwiched by the gate trench portion 40 and the dummy trench portion 30. That is, the electron current of the present example flow through the vicinity of the middle of the mesa portion 60, not portions near the gate trench portion 40. The effect of this flow of the electron current through the vicinity of the middle of the mesa portion 60 arises due to a plurality of accumulation regions being arrayed in the depth direction.

If electron current flows through the vicinity of the middle of the mesa portion 60, the hole distribution at portions near a bottom portion of the mesa portion 60 is divided in the vicinity of the middle of the mesa portion 60. Because of this, holes on the dummy trench portion 30 side relative to the path of the electron current do not flow toward the gate trench portion 40 side. This division of the hole distribution at a middle portion of the mesa portion 60 suppresses accumulation of holes at the lower end of the gate trench portion 40. As a result, displacement current can be reduced in the example of FIG. 11, as compared with the example of FIG. 10. Because displacement current can be reduced, charging of the gate conductive portion 44 is also reduced, and an instantaneous increase in gate electrode Vge can also be suppressed. Thereby, the voltage reduction ratio (dV/dt) of inter-collector-emitter voltage can also be suppressed.

The present inventors confirmed by simulation that holes are mainly distributed at the lower ends of gate trench portions 40 and the lower ends and side portions of dummy trench portions 30 and are scarcely distributed at middle portions of mesa portions 60. As one example, holes are present at portions near the lower ends of gate trench portions 40 and at portions near the lower ends of dummy trench portions 30 on the order of 1E+13 [cm$^{-3}$], which is sufficiently lower than 1E+16 [cm$^{-3}$] in the example of FIG. 10. 1E+13 means $1 \times 10^{13}$.

Although not being limited to the above-mentioned reason, the hole distribution in the example of FIG. 11 is considered to be due to the hole distribution between the gate trench portion 40 and the dummy trench portion 30 being divided by electron current. In addition, due to the hole distribution, at the time of turn-ON, displacement current smaller than that in the example of FIG. 10 flows from portions near the lower end of the dummy trench portion 30 to portions near the lower end of the gate trench portion 40.

Therefore, because in the present example, the displacement current is small as compared with that in the example of FIG. 10, dV/dt becomes small as compared with that in the example of FIG. 11, and electromagnetic noises also can be reduced. In addition, in the present example, an additional gate resistance Rg for the purpose of suppressing a rapid increase in the potential of the gate conductive portion 44 may alternatively not be connected to the gate conductive portion 44. Alternatively, a steep increase in the potential of the gate conductive portion 44 can be suppressed if a small gate resistance Rg is connected to the gate conductive portion 44. Accordingly, power loss at the time of turn-ON can be reduced as compared with the example of FIG. 10.

The number of accumulation regions 16 provided to a mesa portion 60 may be two. The number of accumulation regions 16 may alternatively be three or larger, but this may cause an excessive increase in accumulation of carriers, in some cases. Thereby, for example, characteristics at the time of turn-OFF may deteriorate in some cases. Note that the number of accumulation regions 16 to be provided to a mesa portion 60 is not limited to two. In addition, the number of accumulation regions 16 provided to a mesa portion 60 may alternatively be one.

Figure 12:
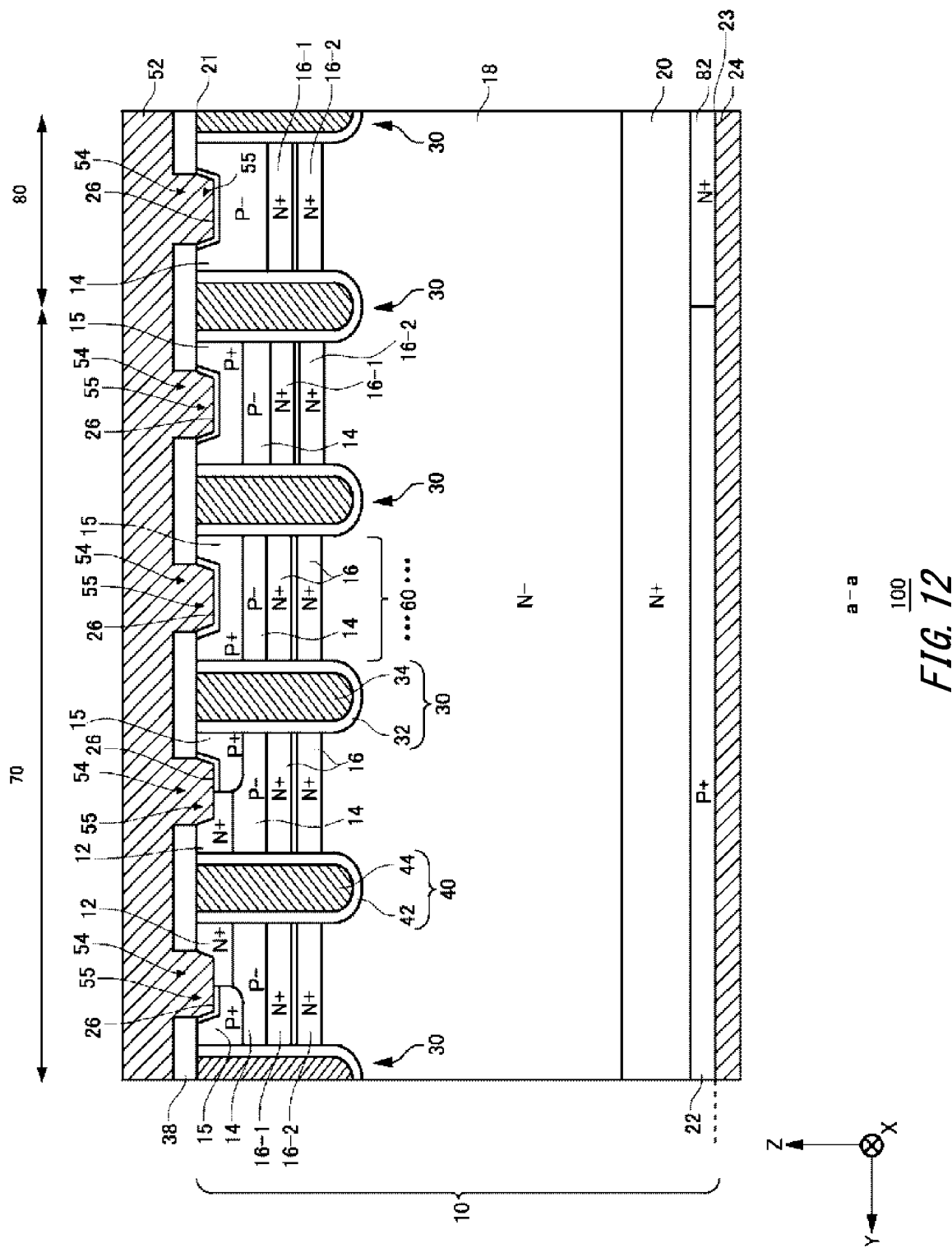
FIG. 12 is a figure showing another example cross-section taken along a-a of the semiconductor device 100.

FIG. 12 is a figure showing another example cross-section taken along a-a of the semiconductor device 100. The semiconductor device 100 of the present example is different from the semiconductor device 100 explained with reference to FIG. 1 to FIG. 11 in that trench contact portions 55 are provided to mesa portions 60 adjacent to a gate trench portion 40. Structures other than the trench contact portions 55 may be the same as those in the semiconductor device 100 in any of the aspects explained with reference to FIG. 1 to FIG. 11. In addition, the trench contact portions 55 may be provided also to mesa portions 60 not adjacent to gate trench portions 40. The respective trench contact portions 55 are spaces provided to regions that are in the upper surface 21 of the semiconductor substrate 10 and exposed through contact holes 54.

The trench contact portions 55 provided to the mesa portions 60 adjacent to the gate trench portion 40 contact respective emitter regions 12 and contact regions 15, and are provided spreading from the upper surface 21 of the semiconductor substrate 10 and reaching positions shallower than bottom portions of the emitter regions 12. The bottom portions of the emitter regions 12 are portions that are most distanced from the upper surface 21 of the semiconductor substrate 10 in the Z-axis direction.

The inside of the trench contact portions 55 may be provided with emitter electrodes 52. In other cases, the inside of the trench contact portions 55 may alternatively be filled with a conductive material connected with the emitter electrode 52. The conductive material with which the inside of the trench contact portions 55 are filled may include tungsten. By providing the trench contact portions 55, the contact resistance between the emitter regions 12 and contact regions 15 and the emitter electrode 52 can be reduced. By reducing the contact resistance between the contact regions 15 and the emitter electrode 52, the latch-up withstand capability of the semiconductor device 100 can be improved. By providing the emitter regions 12 in stripe shapes and providing the trench contact portions 55, realization of large current and high speed can be attempted while maintaining the latch-up withstand capability.

Second conductivity-type high concentration regions 26 having a doping concentration higher than that of the contact regions 15 may be provided in regions that are in the contact regions 15 and contact the trench contact portions 55. The doping concentration of the high concentration regions 26 may be equal to or higher than 200% of the doping concentration of the contact regions 15, may be equal to or higher than 500% of the doping concentration of the contact regions 15 or may alternatively be equal to or higher than 1,000% of the doping concentration of the contact regions 15. By providing the high concentration regions 26, the contact resistance between the contact regions 15 and the emitter electrode 52 can further be reduced.

The trench contact portions 55 provided to the mesa portions 60 not adjacent to the gate trench portion 40 contact base regions 14 or contact regions 15. The trench contact portions 55 provided to the mesa portions 60 not adjacent to the gate trench portion 40 and the trench contact portions 55 provided to the mesa portions 60 adjacent to the gate trench portion 40 may be formed to reach the same depth or may alternatively be formed to reach different depths. As one example, the trench contact portions 55 provided to the mesa portions 60 not adjacent to the gate trench portion 40 may be formed to be deeper than the trench contact portions 55 provided to the mesa portions 60 adjacent to the gate trench portion 40.

Figure 13:
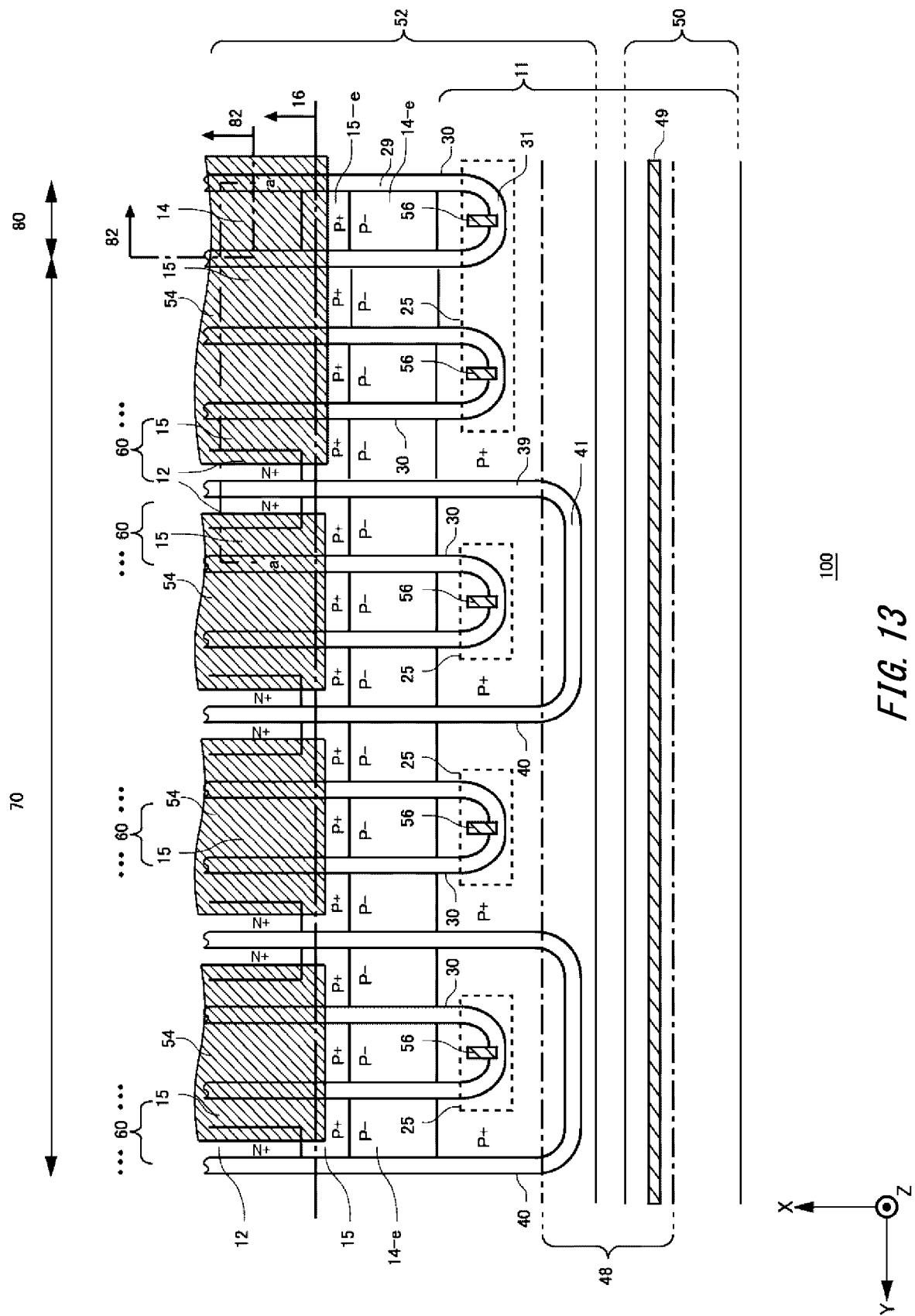
FIG. 13 is a figure showing another example upper surface of the semiconductor device 100.

FIG. 13 is a figure showing another example upper surface of the semiconductor device 100. The semiconductor device 100 of the present example is different from the semiconductor device 100 shown in FIG. 1 to FIG. 11 in that the width of contact holes 54 in the Y-axis direction is larger than the width of any of the mesa portions 60 in the Y-axis direction. Structures other than the contact holes 54 may be the same as those of the semiconductor device 100 in any of the aspects shown in FIG. 1 to FIG. 11.

In the present example, the diode portion 80 is provided with a contact hole 54 continuously and entirely in the Y-axis direction. That is, the width, in the Y-axis direction, of the contact hole 54 provided above the diode portion 80 is larger than the width of the diode portion 80 in the Y-axis direction.

The transistor portion 70 is provided with contact holes 54 in gate trench portions 40 and regions other than regions adjacent to the gate trench portions 40. That is, the gate trench portions 40 and the regions adjacent to the gate trench portions 40 are covered with the interlayer dielectric film 38, and the other regions are not covered with the interlayer dielectric film 38. The contact holes 54 may be provided continuously above mesa portions 60 sandwiched by dummy trench portions 30, above the dummy trench portions 30, and above part of mesa portions 60 sandwiched by gate trench portions 40 and dummy trench portions 30. The contact holes 54 may cover part and expose other part, in the Y-axis direction, of emitter regions 12 adjacent to gate trench portions 40.

By continuously providing the contact holes 54 also above the dummy trench portions 30, it becomes easier to ensure the distances between gate trench portions 40 and contact holes 54. Because of this, it becomes easier to miniaturize mesa portions 60.

Figure 14:
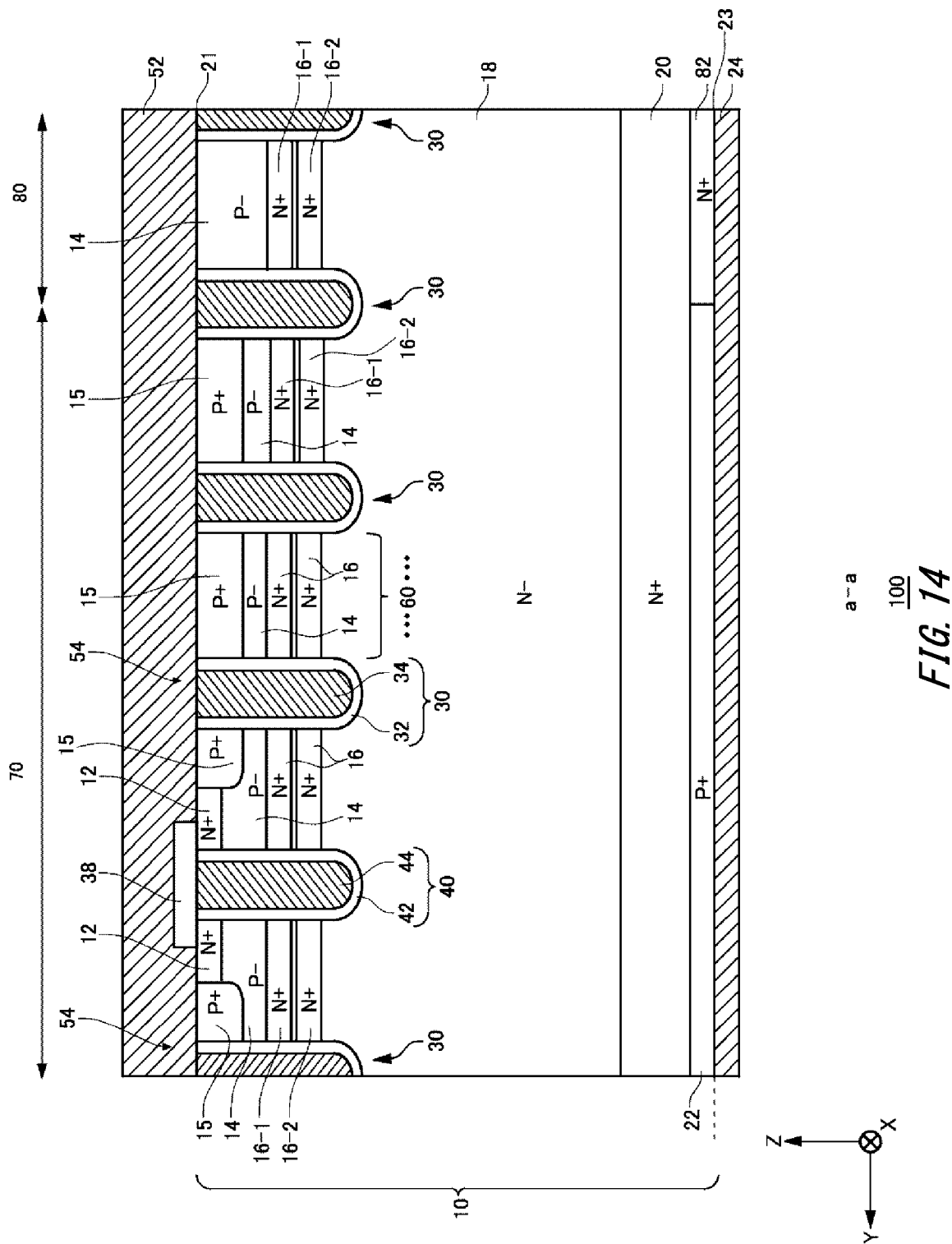
FIG. 14 is a figure showing an example cross-section taken along a-a in FIG. 13.

FIG. 14 is a figure showing an example cross-section taken along a-a in FIG. 13. As mentioned above, the interlayer dielectric film 38 is provided, in the Y-axis direction, above a gate trench portion 40 and above part of mesa portions 60 that are adjacent to the gate trench portion 40, and contact holes 54 are provided in the rest of the regions in the Y-axis direction.

In a mesa portion 60 adjacent to the gate trench portion 40, the interlayer dielectric film 38 covers a portion that is in an emitter region 12 and is adjacent to the gate trench portion 40, and does not cover a portion that is in the emitter region 12 and is adjacent to a contact region 15. In addition, it does not cover the contact region 15 even partially. In addition, the interlayer dielectric film 38 does not cover, in the cross-section, above dummy trench portions 30 and mesa portions 60 that are not adjacent to the gate trench portion 40.

Figure 15:
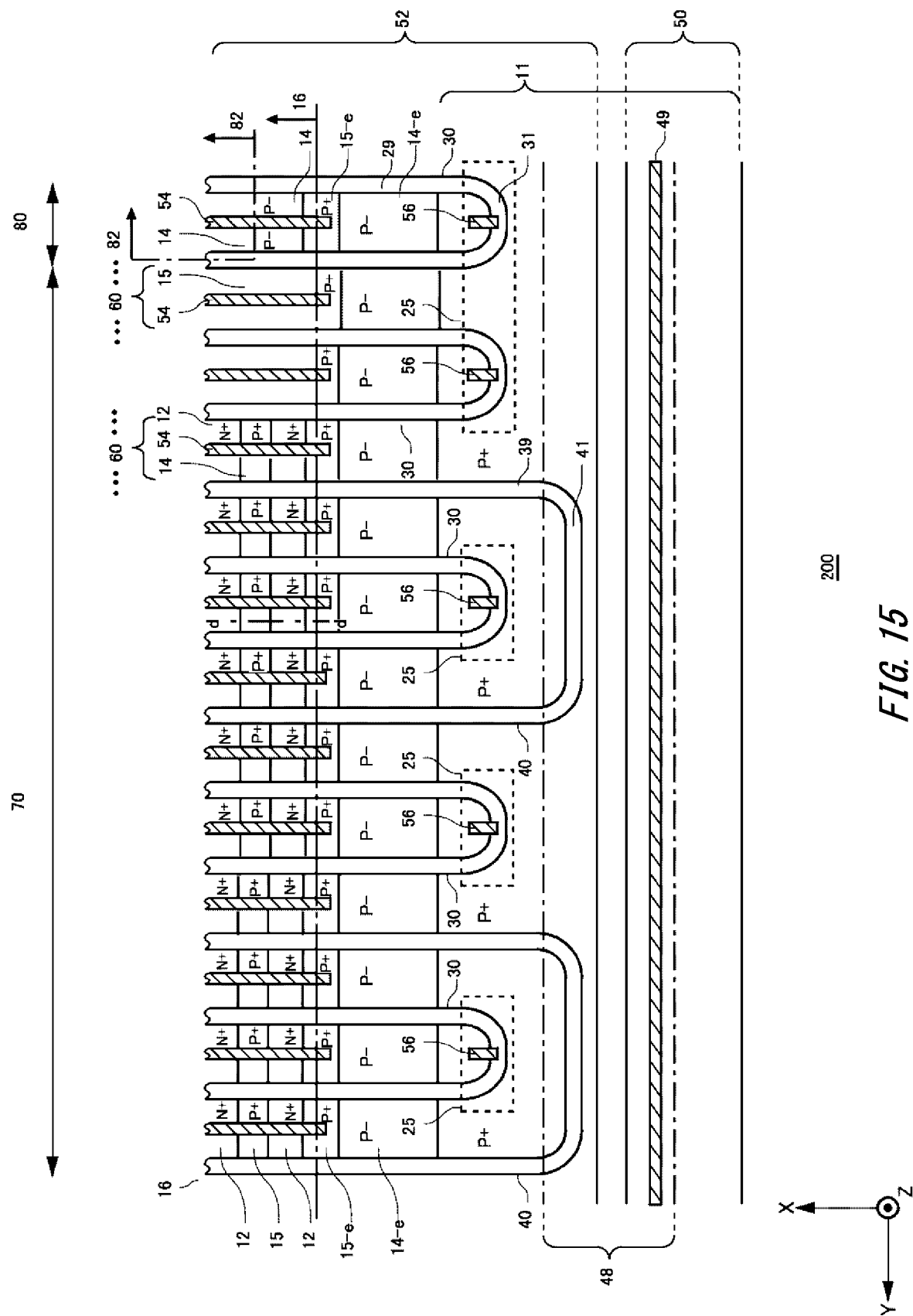
FIG. 15 is a top view showing an example semiconductor device 200 according to one embodiment of the present invention.

FIG. 15 is a top view showing an example semiconductor device 200 according to one embodiment of the present invention. The semiconductor device 200 is different from the semiconductor device 100 in terms of the arrangement of emitter regions 12 and contact regions 15 in the transistor portion 70. The other structures are the same as those of the semiconductor device 100.

In each mesa portion 60 of the transistor portion 70, emitter regions 12 and contact regions 15 are arrayed alternately in the X-axis direction. At the upper surface of the semiconductor substrate, the respective emitter regions 12 and contact regions 15 are provided spreading from one of trench portions arranged on both sides of a mesa portion 60 and reaching the other trench portion. That is, the widths of the emitter regions 12 and contact regions 15 in the Y-axis direction are the same as the width of the mesa portion 60 in the Y-axis direction. The lengths of the emitter regions 12 and contact regions 15 in the X-axis direction may be smaller than their widths in the Y-axis direction, may alternatively be the same as the widths or may alternatively be larger than the widths.

Figure 16:
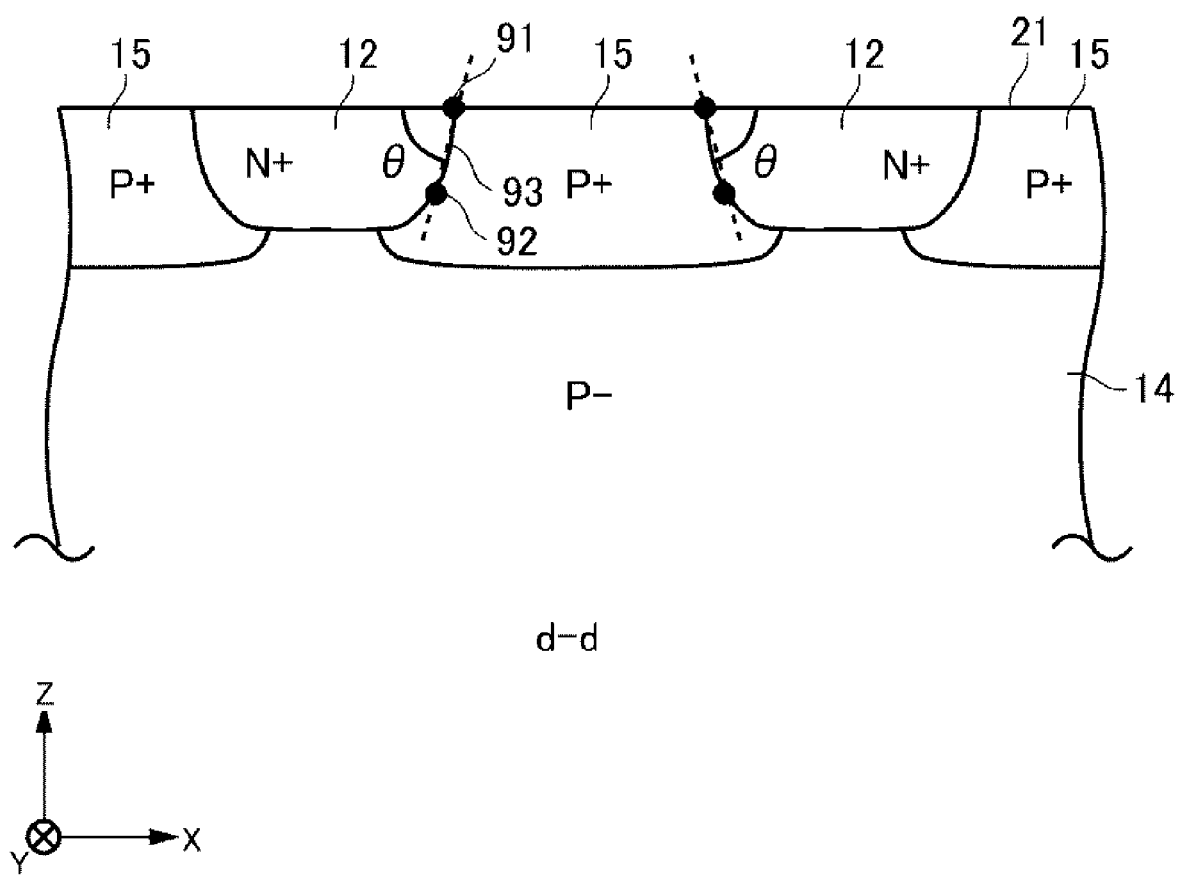
FIG. 16 is a figure showing an example cross-section taken along d-d in FIG. 15.

FIG. 16 is a figure showing an example cross-section taken along d-d in FIG. 15. The cross-section taken along d-d is an XZ plane that passes through a mesa portion 60 of the transistor portion 70, is parallel with the X-axis direction and is perpendicular to the upper surface 21 of the semiconductor substrate 10. As mentioned above, in the mesa portion 60, emitter regions 12 and contact regions 15 are arrayed alternately in the X-axis direction.

In the present example, in the cross-section, the inclination θ of the cross-section boundary 93 between a contact region 15 and an emitter region 12 relative to the upper surface 21 of the semiconductor substrate 10 is equal to or larger than 70 degrees and equal to or smaller than 110 degrees. The inclination θ of the cross-section boundary 93 may be the inclination of a straight line linking the end portion 91 and the point 92, similar to the cross-section boundary 93 explained with reference to FIG. 4. At all the boundaries between contact regions 15 and emitter regions 12, the inclination θ of the cross-section boundary 93 is preferably equal to or larger than 70 degrees and equal to or smaller than 110 degrees.

Thereby, because the cross-section boundary 93 is approximately perpendicular, the lengths of emitter regions 12 in the X-axis direction can be adjusted accurately. Because of this, the length, in the X-axis direction, of a region at which an emitter region 12 and a gate trench portion 40 are adjacent to each other (that is, the width of a channel) can be adjusted accurately.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCE SYMBOLS

10: semiconductor substrate; 11: well region; 12: emitter region; 14: base region; 15: contact region; 16: accumulation region; 18: drift region; 20: buffer region; 21: upper surface; 22: collector region; 23: lower surface; 24: collector electrode; 25: connecting portion; 26: high concentration region; 29: extending portion; 30: dummy trench portion; 31: connection portion; 32: dummy insulating film; 34: dummy conductive portion; 38: interlayer dielectric film; 39: extending portion; 40: gate trench portion; 41: connection portion; 42: gate insulating film; 44: gate conductive portion; 48: gate runner; 49: contact hole; 50: gate electrode; 52: emitter electrode; 54: contact hole; 55: trench contact portion; 56: contact hole; 60: mesa portion; 70: transistor portion; 80: diode portion; 82: cathode region; 91: end portion; 92: point; 93: cross-section boundary; 100: semiconductor device; 200: semiconductor device

What is claimed is:

1. A semiconductor device comprising:
a semiconductor substrate having a first conductivity-type drift region;
a gate trench portion that is provided spreading from an upper surface of the semiconductor substrate and reaching an inside of the semiconductor substrate and is provided extending in a predetermined direction of extension at the upper surface of the semiconductor substrate;
a dummy trench portion that is provided spreading from the upper surface of the semiconductor substrate and reaching the inside of the semiconductor substrate and is provided extending in the direction of extension at the upper surface of the semiconductor substrate;
a mesa portion that is provided inside the semiconductor substrate and is sandwiched by the gate trench portion and the dummy trench portion;
a first conductivity-type emitter region that is provided inside the mesa portion and between the upper surface of the semiconductor substrate and the drift region, is provided at an upper surface of the mesa portion and directly contacts the gate trench portion and has a doping concentration higher than that of the drift region; and
a second conductivity-type contact region that is provided inside the mesa portion and between the upper surface of the semiconductor substrate and the drift region and is provided at the upper surface of the mesa portion and directly contacts the dummy trench portion, wherein
at least either the first conductivity-type emitter region or the second conductivity-type contact region is provided in a stripe shape extending in the direction of extension at the upper surface of the semiconductor substrate.

2. The semiconductor device according to claim 1, further comprising a second conductivity-type base region that is provided inside the semiconductor substrate and between the upper surface of the semiconductor substrate and the drift region and has a doping concentration lower than that of the second conductivity-type contact region, wherein
the first conductivity-type emitter region and the second conductivity-type contact region are provided between the upper surface of the semiconductor substrate and the base region, and the second conductivity-type contact region is provided reaching a position deeper than the first conductivity-type emitter region as seen from the upper surface of the semiconductor substrate.

3. The semiconductor device according to claim 2, wherein at the upper surface of the semiconductor substrate, widths of the second conductivity-type contact region and the first conductivity-type emitter region in a direction perpendicular to the direction of extension are the same.

4. The semiconductor device according to claim 1, wherein in a cross-section of the semiconductor substrate that is perpendicular to the direction of extension, an inclination of a cross-section boundary between the second conductivity-type contact region and the first conductivity-type emitter region relative to the upper surface of the semiconductor substrate is equal to or larger than 70 degrees and equal to or smaller than 110 degrees.

5. A semiconductor device comprising:
- a semiconductor substrate having a first conductivity-type drift region;
- a gate trench portion that is provided spreading from an upper surface of the semiconductor substrate and reaching an inside of the semiconductor substrate and is provided extending in a predetermined direction of extension at the upper surface of the semiconductor substrate;
- a dummy trench portion that is provided spreading from the upper surface of the semiconductor substrate and reaching the inside of the semiconductor substrate and is provided extending in the direction of extension at the upper surface of the semiconductor substrate;
- a mesa portion that is provided inside the semiconductor substrate and is sandwiched by the gate trench portion and the dummy trench portion;
- a first conductivity-type emitter region that is provided inside the mesa portion and between the upper surface of the semiconductor substrate and the drift region, is provided at an upper surface of the mesa portion and adjacent to the gate trench portion and has a doping concentration higher than that of the drift region; and
- a second conductivity-type contact region that is provided inside the mesa portion and between the upper surface of the semiconductor substrate and the drift region and is provided at the upper surface of the mesa portion and adjacent to the dummy trench portion, wherein
- at least either the first conductivity-type emitter region or the second conductivity-type contact region is provided in a stripe shape extending in the direction of extension at the upper surface of the semiconductor substrate, and
- in a depth direction perpendicular to the upper surface of the semiconductor substrate, a doping concentration distribution of the second conductivity-type contact region has a plurality of peaks.

6. The semiconductor device according to claim 5, wherein in a depth direction perpendicular to the upper surface of the semiconductor substrate, a doping concentration distribution of the first conductivity-type emitter region has a plurality of peaks.

7. The semiconductor device according to claim 6, wherein at respective peak positions of the doping concentration distribution of the second conductivity-type contact region, dopants having highest concentrations are the same type of dopant.

8. The semiconductor device according to claim 7, wherein at any two peak positions of the doping concentration distribution of the first conductivity-type emitter region, dopants having highest concentrations are different types of dopant.

9. The semiconductor device according to claim 6, wherein respective peak positions in the doping concentration distribution of the second conductivity-type contact region and respective peak positions in the doping concentration distribution of the first conductivity-type emitter region are different.

10. The semiconductor device according to claim 9, wherein respective peak positions in the doping concentration distribution of the second conductivity-type contact region and respective peak positions in the doping concentration distribution of the first conductivity-type emitter region are arranged alternately in the depth direction.

11. The semiconductor device according to claim 2, further comprising an accumulation region that is provided in the mesa portion and between the base region and the drift region and has a doping concentration higher than that of the drift region.

12. The semiconductor device according to claim 11, comprising a first accumulation region of the accumulation regions and a second accumulation region of the accumulation regions, the first accumulation region and the second accumulation region being provided at different positions in a depth direction perpendicular to the upper surface of the semiconductor substrate.

13. A semiconductor device comprising:
- a semiconductor substrate having a first conductivity-type drift region;
- a gate trench portion that is provided spreading from an upper surface of the semiconductor substrate and reaching an inside of the semiconductor substrate and is provided extending in a predetermined direction of extension at the upper surface of the semiconductor substrate;
- a dummy trench portion that is provided spreading from the upper surface of the semiconductor substrate and reaching the inside of the semiconductor substrate and is provided extending in the direction of extension at the upper surface of the semiconductor substrate;
- a mesa portion that is provided inside the semiconductor substrate and is sandwiched by the gate trench portion and the dummy trench portion;
- a first conductivity-type emitter region that is provided inside the mesa portion and between the upper surface of the semiconductor substrate and the drift region, is provided at an upper surface of the mesa portion and adjacent to the gate trench portion and has a doping concentration higher than that of the drift region; and
- a second conductivity-type contact region that is provided inside the mesa portion and between the upper surface of the semiconductor substrate and the drift region and is provided at the upper surface of the mesa portion and adjacent to the dummy trench portion, wherein
- at least either the first conductivity-type emitter region or the second conductivity-type contact region is provided in a stripe shape extending in the direction of extension at the upper surface of the semiconductor substrate, and
- in the mesa portion, a trench contact portion that allows an emitter electrode to directly contact each of the first conductivity-type emitter region and the second conductivity-type contact region is provided spreading from the upper surface of the semiconductor substrate and reaching a position shallower than a bottom portion of the first conductivity-type emitter region.

14. The semiconductor device according to claim 13, wherein in a region that is in the second conductivity-type contact region and contacts the trench contact portion, a second conductivity-type high concentration region having a doping concentration higher than that of the second conductivity-type contact region is provided.

15. The semiconductor device according to claim 1, further comprising an interlayer dielectric film provided above the upper surface of the semiconductor substrate, wherein
the interlayer dielectric film is provided with a contact hole having a width, in a direction perpendicular to the direction of extension, which is larger than a width of the mesa portion.

16. A semiconductor device comprising:
a semiconductor substrate having a first conductivity-type drift region;
a plurality of trench portions that are provided spreading from an upper surface of the semiconductor substrate and reaching an inside of the semiconductor substrate and are provided extending in a predetermined direction of extension at the upper surface of the semiconductor substrate;
a mesa portion that is provided inside the semiconductor substrate and is sandwiched by two of the trench portions;
a first conductivity-type emitter region that is provided in the mesa portion and between the upper surface of the semiconductor substrate and the drift region and has a doping concentration higher than that of the drift region; and
a second conductivity-type contact region provided in the mesa portion and between the upper surface of the semiconductor substrate and the drift region, wherein
in a cross-section that is parallel with the direction of extension and perpendicular to the upper surface of the semiconductor substrate, an inclination of a cross-section boundary between the second conductivity-type contact region and the first conductivity-type emitter region relative to the upper surface of the semiconductor substrate is equal to or larger than 70 degrees and equal to or smaller than 110 degrees.

17. The semiconductor device according to claim 16, wherein
at least either the first conductivity-type emitter region or the second conductivity-type contact region is provided in a stripe shape extending in the direction of extension at the upper surface of the semiconductor substrate.

18. The semiconductor device according to claim 5, wherein
the first conductivity-type emitter region is further provided to directly contact the gate trench portion and has a doping concentration higher than that of the drift region; and
the second conductivity-type contact region is further provided to directly contact the dummy trench portion.

19. The semiconductor device according to claim 13, further comprising an emitter electrode that contacts each of the first conductivity-type emitter region and the second conductivity-type contact region in the trench contact portion.

20. The semiconductor device according to claim 17, wherein
the plurality of trench portions includes:
a gate trench portion that is provided spreading from an upper surface of the semiconductor substrate and reaching an inside of the semiconductor substrate and is provided extending in a predetermined direction of extension at the upper surface of the semiconductor substrate; and
a dummy trench portion that is provided spreading from the upper surface of the semiconductor substrate and reaching the inside of the semiconductor substrate and is provided extending in the direction of extension at the upper surface of the semiconductor substrate, wherein
the first conductivity-type emitter region is provided inside the mesa portion and between the upper surface of the semiconductor substrate and the drift region, and is provided at an upper surface of the mesa portion and adjacent to the gate trench portion and has a doping concentration higher than that of the drift region; and
a second conductivity-type contact region is provided inside the mesa portion and between the upper surface of the semiconductor substrate and the drift region, and is provided at the upper surface of the mesa portion and adjacent to the dummy trench portion.

* * * * *